(12) United States Patent
Oganesian et al.

(10) Patent No.: US 9,640,437 B2
(45) Date of Patent: May 2, 2017

(54) METHODS OF FORMING SEMICONDUCTOR ELEMENTS USING MICRO-ABRASIVE PARTICLE STREAM

(75) Inventors: Vage Oganesian, Palo Alto, CA (US); Belgacem Haba, Saratoga, CA (US); Craig Mitchell, San Jose, CA (US); Ilyas Mohammed, Santa Clara, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 227 days.

(21) Appl. No.: 12/842,612

(22) Filed: Jul. 23, 2010

(65) Prior Publication Data

US 2012/0018893 A1    Jan. 26, 2012

(51) Int. Cl.
*H01L 23/48* (2006.01)
*H01L 21/768* (2006.01)
(Continued)

(52) U.S. Cl.
CPC ........ *H01L 21/76898* (2013.01); *B24C 1/045* (2013.01); *B24C 3/322* (2013.01);
(Continued)

(58) Field of Classification Search
CPC ... B24C 1/045; B24C 3/322; H01L 21/76898; H01L 21/481; H01L 21/05;
(Continued)

(56) References Cited

U.S. PATENT DOCUMENTS

| 4,074,342 A | 2/1978 | Honn et al. |
| 4,682,074 A | 7/1987 | Hoeberechts et al. |

(Continued)

FOREIGN PATENT DOCUMENTS

| CN | 1327263 A | 12/2001 |
| CN | 1490875 A | 4/2004 |

(Continued)

OTHER PUBLICATIONS

International Search Report and Written Opinion for Application No. PCT/US2011/060553 dated Oct. 26, 2012.
(Continued)

*Primary Examiner* — Vongsavanh Sengdara
(74) *Attorney, Agent, or Firm* — Lerner, David, Littenberg, Krumholz & Mentlik, LLP

(57) ABSTRACT

A method of fabricating a microelectronic unit includes providing a semiconductor element having a front surface and a rear surface remote from the front surface, forming at least one first opening extending from the rear surface partially through the semiconductor element towards the front surface by directing a jet of fine abrasive particles towards the semiconductor element, and forming at least one conductive contact and at least one conductive interconnect coupled thereto. The semiconductor element can include a plurality of active semiconductor devices therein. The semiconductor element can include a plurality of conductive pads exposed at the front surface. Each conductive interconnect can extend within one or more of the first openings and can be coupled directly or indirectly to at least one of the conductive pads. Each of the conductive contacts can be exposed at the rear surface of the semiconductor element for electrical connection to an external device.

51 Claims, 12 Drawing Sheets

(51) Int. Cl.
  *B24C 1/04* (2006.01)
  *B24C 3/32* (2006.01)
  *H01L 23/498* (2006.01)
  *H01L 23/00* (2006.01)

(52) U.S. Cl.
  CPC ............ *H01L 23/481* (2013.01); *H01L 24/05* (2013.01); *H01L 23/4985* (2013.01); *H01L 24/03* (2013.01); *H01L 24/06* (2013.01); *H01L 2224/03464* (2013.01); *H01L 2224/05009* (2013.01); *H01L 2224/0557* (2013.01); *H01L 2224/05624* (2013.01); *H01L 2224/05647* (2013.01); *H01L 2224/05666* (2013.01); *H01L 2224/06181* (2013.01); *H01L 2924/0002* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01023* (2013.01); *H01L 2924/01029* (2013.01); *H01L 2924/01033* (2013.01); *H01L 2924/01047* (2013.01); *H01L 2924/01061* (2013.01); *H01L 2924/01076* (2013.01); *H01L 2924/01079* (2013.01); *H01L 2924/01082* (2013.01); *H01L 2924/10329* (2013.01); *H01L 2924/14* (2013.01); *H01L 2924/1433* (2013.01); *H01L 2924/1434* (2013.01)

(58) Field of Classification Search
  CPC . H01L 2224/03464; H01L 2224/05009; H01L 2224/05552; H01L 2224/0557; H01L 2224/05624; H01L 2224/05647; H01L 2224/05666; H01L 2224/06181; H01L 23/481; H01L 23/4985; H01L 24/03; H01L 24/05; H01L 24/06; H01L 2924/00; H01L 2924/00014; H01L 2924/0002; H01L 2924/01005; H01L 2924/01006; H01L 2924/01013; H01L 2924/01023; H01L 2924/01029; H01L 2924/01033; H01L 2924/01047; H01L 2924/01061; H01L 2924/01076; H01L 2924/01079; H01L 2924/01082; H01L 2924/014; H01L 2924/10329; H01L 2924/14; H01L 2924/1434; H01L 2924/1433
  USPC ........... 257/773, E21.585, E23.142; 438/637
  See application file for complete search history.

(56) References Cited

U.S. PATENT DOCUMENTS

| | | | |
|---|---|---|---|
| 4,765,864 | A | 8/1988 | Holland et al. |
| 4,941,033 | A | 7/1990 | Kishida |
| 5,148,265 | A | 9/1992 | Khandros et al. |
| 5,148,266 | A | 9/1992 | Khandros et al. |
| 5,229,647 | A | 7/1993 | Gnadinger |
| 5,322,816 | A | 6/1994 | Pinter |
| 5,334,561 | A | 8/1994 | Matsui et al. |
| 5,347,159 | A | 9/1994 | Khandros et al. |
| 5,481,133 | A | 1/1996 | Hsu |
| 5,511,428 | A | 4/1996 | Goldberg et al. |
| 5,679,977 | A | 10/1997 | Khandros et al. |
| 5,686,762 | A | 11/1997 | Langley |
| 5,700,735 | A | 12/1997 | Shiue et al. |
| 5,703,408 | A | 12/1997 | Ming-Tsung et al. |
| 5,808,874 | A | 9/1998 | Smith |
| 5,821,608 | A | 10/1998 | DiStefano et al. |
| 5,998,861 | A | 12/1999 | Hiruta |
| 6,002,161 | A | 12/1999 | Yamazaki |
| 6,005,466 | A | 12/1999 | Pedder |
| 6,013,948 | A | 1/2000 | Akram et al. |
| 6,022,758 | A | 2/2000 | Badehi |
| 6,031,274 | A | 2/2000 | Muramatsu et al. |
| 6,037,668 | A | 3/2000 | Cave et al. |
| 6,103,552 | A | 8/2000 | Lin |
| 6,143,369 | A | 11/2000 | Sugawa et al. |
| 6,143,396 | A | 11/2000 | Saran et al. |
| 6,169,319 | B1 | 1/2001 | Malinovich et al. |
| 6,181,016 | B1 | 1/2001 | Lin et al. |
| 6,261,865 | B1 | 7/2001 | Akram |
| 6,277,669 | B1 | 8/2001 | Kung et al. |
| 6,284,563 | B1 | 9/2001 | Fjelstad |
| 6,313,024 | B1 | 11/2001 | Cave et al. |
| 6,313,540 | B1 | 11/2001 | Kida et al. |
| 6,362,529 | B1 | 3/2002 | Sumikawa et al. |
| 6,368,410 | B1 | 4/2002 | Gorczyca et al. |
| 6,399,892 | B1 | 6/2002 | Milkovich et al. |
| 6,472,247 | B1 | 10/2002 | Andoh et al. |
| 6,492,201 | B1 | 12/2002 | Haba |
| 6,498,381 | B2 | 12/2002 | Halahan et al. |
| 6,498,387 | B1 | 12/2002 | Yang |
| 6,507,113 | B1 | 1/2003 | Fillion et al. |
| 6,531,384 | B1 | 3/2003 | Kobayashi et al. |
| 6,555,913 | B1 | 4/2003 | Sasaki et al. |
| 6,586,955 | B2 | 7/2003 | Fjelstad et al. |
| 6,608,377 | B2 | 8/2003 | Chang et al. |
| 6,638,352 | B2 | 10/2003 | Satsu et al. |
| 6,693,358 | B2 | 2/2004 | Yamada et al. |
| 6,716,737 | B2 | 4/2004 | Plas et al. |
| 6,727,576 | B2 | 4/2004 | Hedler et al. |
| 6,737,300 | B2 | 5/2004 | Ding et al. |
| 6,743,660 | B2 | 6/2004 | Lee et al. |
| 6,812,549 | B2 | 11/2004 | Umetsu et al. |
| 6,828,175 | B2 | 12/2004 | Wood et al. |
| 6,853,046 | B2 | 2/2005 | Shibayama |
| 6,864,172 | B2 | 3/2005 | Noma et al. |
| 6,867,123 | B2 | 3/2005 | Katagiri et al. |
| 6,873,054 | B2 | 3/2005 | Miyazawa et al. |
| 6,879,049 | B1 | 4/2005 | Yamamoto et al. |
| 6,914,336 | B2 | 7/2005 | Matsuki et al. |
| 6,927,156 | B2 | 8/2005 | Mathew |
| 6,936,913 | B2 | 8/2005 | Akerling et al. |
| 6,982,475 | B1 | 1/2006 | MacIntyre |
| 7,026,175 | B2 | 4/2006 | Li et al. |
| 7,068,139 | B2 | 6/2006 | Harris et al. |
| 7,091,062 | B2 | 8/2006 | Geyer |
| 7,112,874 | B2 | 9/2006 | Atlas |
| 7,271,033 | B2 | 9/2007 | Lin et al. |
| 7,329,563 | B2 | 2/2008 | Lo et al. |
| 7,413,929 | B2 | 8/2008 | Lee et al. |
| 7,420,257 | B2 | 9/2008 | Shibayama |
| 7,436,069 | B2 | 10/2008 | Matsui |
| 7,446,036 | B1 | 11/2008 | Bolom et al. |
| 7,456,479 | B2 | 11/2008 | Lan |
| 7,531,445 | B2 | 5/2009 | Shiv |
| 7,531,453 | B2 | 5/2009 | Kirby et al. |
| 7,719,121 | B2 | 5/2010 | Humpston et al. |
| 7,750,487 | B2 | 7/2010 | Muthukumar et al. |
| 7,754,531 | B2 | 7/2010 | Tay et al. |
| 7,767,497 | B2 | 8/2010 | Haba |
| 7,781,781 | B2 | 8/2010 | Adkisson et al. |
| 7,791,199 | B2 | 9/2010 | Grinman et al. |
| 7,807,508 | B2 | 10/2010 | Oganesian et al. |
| 7,829,976 | B2 | 11/2010 | Kirby et al. |
| 7,834,273 | B2 | 11/2010 | Takahashi et al. |
| 7,901,989 | B2 | 3/2011 | Haba et al. |
| 7,915,710 | B2 | 3/2011 | Lee et al. |
| 7,935,568 | B2 | 5/2011 | Oganesian et al. |
| 8,008,121 | B2 | 8/2011 | Choi et al. |
| 8,008,192 | B2 | 8/2011 | Sulfridge |
| 8,193,615 | B2 | 6/2012 | Haba et al. |
| 8,253,244 | B2 | 8/2012 | Kang |
| 8,263,434 | B2 | 9/2012 | Pagaila et al. |
| 8,299,608 | B2 | 10/2012 | Bartley et al. |
| 8,310,036 | B2 | 11/2012 | Haba et al. |
| 8,405,196 | B2 | 3/2013 | Haba et al. |
| 8,421,193 | B2 | 4/2013 | Huang |
| 8,421,238 | B2 | 4/2013 | Inagaki |
| 2001/0028098 | A1 | 10/2001 | Liou |
| 2001/0048591 | A1 | 12/2001 | Fjelstad et al. |

(56) References Cited

U.S. PATENT DOCUMENTS

| | | |
|---|---|---|
| 2002/0030245 A1 | 3/2002 | Hanaoka et al. |
| 2002/0048668 A1 | 4/2002 | Inoue |
| 2002/0061723 A1 | 5/2002 | Duescher |
| 2002/0096787 A1 | 7/2002 | Fjelstad |
| 2002/0109236 A1 | 8/2002 | Kim et al. |
| 2002/0127839 A1 | 9/2002 | Umetsu et al. |
| 2002/0151171 A1 | 10/2002 | Furusawa |
| 2003/0047351 A1 | 3/2003 | Satsu et al. |
| 2003/0049193 A1 | 3/2003 | Satsu et al. |
| 2003/0059976 A1 | 3/2003 | Nathan et al. |
| 2003/0071331 A1 | 4/2003 | Yamaguchi et al. |
| 2003/0178714 A1 | 9/2003 | Sakoda et al. |
| 2004/0016942 A1* | 1/2004 | Miyazawa ............ H01L 21/268 257/200 |
| 2004/0017012 A1 | 1/2004 | Yamada et al. |
| 2004/0043607 A1 | 3/2004 | Farnworth et al. |
| 2004/0051173 A1 | 3/2004 | Koh et al. |
| 2004/0061238 A1 | 4/2004 | Sekine |
| 2004/0104454 A1 | 6/2004 | Takaoka et al. |
| 2004/0121606 A1 | 6/2004 | Raskin et al. |
| 2004/0155354 A1 | 8/2004 | Hanaoka et al. |
| 2004/0173891 A1 | 9/2004 | Imai et al. |
| 2004/0178495 A1 | 9/2004 | Yean et al. |
| 2004/0188819 A1 | 9/2004 | Farnworth et al. |
| 2004/0188822 A1 | 9/2004 | Hara |
| 2004/0203224 A1 | 10/2004 | Halahan et al. |
| 2004/0217483 A1 | 11/2004 | Hedler et al. |
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0099259 A1 | 5/2005 | Harris et al. |
| 2005/0106845 A1 | 5/2005 | Halahan et al. |
| 2005/0148160 A1 | 7/2005 | Farnworth et al. |
| 2005/0156330 A1 | 7/2005 | Harris |
| 2005/0181540 A1 | 8/2005 | Farnworth et al. |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1* | 3/2006 | Watkins ............ H01L 21/76898 438/622 |
| 2006/0046471 A1* | 3/2006 | Kirby ................ H01L 21/76898 438/638 |
| 2006/0055050 A1 | 3/2006 | Numata et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0148250 A1 | 7/2006 | Kirby |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1 | 12/2006 | Gibson et al. |
| 2006/0292866 A1 | 12/2006 | Borwick et al. |
| 2007/0035020 A1 | 2/2007 | Umemoto |
| 2007/0045779 A1 | 3/2007 | Hiatt |
| 2007/0052050 A1 | 3/2007 | Dierickx |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1 | 11/2007 | Watkins et al. |
| 2007/0269931 A1* | 11/2007 | Chung ............... H01L 21/76898 438/109 |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0061436 A1 | 3/2008 | Yang et al. |
| 2008/0076195 A1 | 3/2008 | Shiv |
| 2008/0079779 A1* | 4/2008 | Cornell ................ B41J 2/14129 347/55 |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0111213 A1 | 5/2008 | Akram et al. |
| 2008/0116544 A1 | 5/2008 | Grinman et al. |
| 2008/0136038 A1 | 6/2008 | Savastiouk et al. |
| 2008/0150089 A1 | 6/2008 | Kwon et al. |
| 2008/0157273 A1 | 7/2008 | Giraudin et al. |
| 2008/0164574 A1 | 7/2008 | Savastiouk et al. |
| 2008/0185719 A1 | 8/2008 | Cablao et al. |
| 2008/0230923 A1 | 9/2008 | Jo et al. |
| 2008/0246136 A1 | 10/2008 | Haba et al. |
| 2008/0274589 A1 | 11/2008 | Lee et al. |
| 2008/0284041 A1 | 11/2008 | Jang et al. |
| 2009/0008747 A1* | 1/2009 | Hoshino ............. H01L 21/6835 257/621 |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0108464 A1 | 4/2009 | Uchiyama |
| 2009/0133254 A1 | 5/2009 | Kubota et al. |
| 2009/0134498 A1 | 5/2009 | Ikeda et al. |
| 2009/0148591 A1* | 6/2009 | Wang ..................... A61L 31/10 427/2.25 |
| 2009/0166846 A1 | 7/2009 | Pratt et al. |
| 2009/0212381 A1 | 8/2009 | Crisp et al. |
| 2009/0224372 A1 | 9/2009 | Johnson |
| 2009/0243047 A1 | 10/2009 | Wolter et al. |
| 2009/0263214 A1 | 10/2009 | Lee et al. |
| 2009/0267183 A1 | 10/2009 | Temple et al. |
| 2009/0267194 A1 | 10/2009 | Chen |
| 2009/0283662 A1 | 11/2009 | Wu et al. |
| 2009/0294983 A1* | 12/2009 | Cobbley ........... H01L 21/76898 257/774 |
| 2009/0309235 A1 | 12/2009 | Suthiwongsunthorn et al. |
| 2010/0013060 A1 | 1/2010 | Lamy et al. |
| 2010/0038778 A1 | 2/2010 | Lee et al. |
| 2010/0047963 A1 | 2/2010 | Wang et al. |
| 2010/0105169 A1 | 4/2010 | Lee et al. |
| 2010/0117242 A1 | 5/2010 | Miller et al. |
| 2010/0127346 A1 | 5/2010 | DeNatale et al. |
| 2010/0140775 A1 | 6/2010 | Jung |
| 2010/0148371 A1 | 6/2010 | Kaskoun et al. |
| 2010/0155940 A1 | 6/2010 | Kawashita et al. |
| 2010/0159643 A1 | 6/2010 | Takahashi et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1 | 9/2010 | Kriman et al. |
| 2010/0258917 A1 | 10/2010 | Lin |
| 2011/0089573 A1 | 4/2011 | Kurita |
| 2011/0095373 A1 | 4/2011 | Hwang et al. |
| 2011/0195546 A1 | 8/2011 | Yang |
| 2011/0204505 A1 | 8/2011 | Pagaila et al. |
| 2011/0221070 A1 | 9/2011 | Yen et al. |
| 2011/0266674 A1 | 11/2011 | Hsia et al. |
| 2011/0304057 A1 | 12/2011 | Matsumoto |
| 2012/0007232 A1 | 1/2012 | Haba |
| 2012/0018863 A1 | 1/2012 | Oganesian et al. |

(56) References Cited

U.S. PATENT DOCUMENTS

| | | | |
|---|---|---|---|
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0020026 A1 | 1/2012 | Oganesian et al. |
| 2012/0025365 A1 | 2/2012 | Haba |
| 2012/0068330 A1 | 3/2012 | Oganesian et al. |
| 2012/0068351 A1 | 3/2012 | Oganesian et al. |
| 2012/0068352 A1 | 3/2012 | Oganesian et al. |
| 2012/0139094 A1 | 6/2012 | Haba et al. |

FOREIGN PATENT DOCUMENTS

| | | |
|---|---|---|
| CN | 1758430 A | 4/2006 |
| CN | 101350322 A | 1/2009 |
| CN | 101675516 A | 3/2010 |
| CN | 201910420 U | 7/2011 |
| EP | 0316799 A1 | 5/1989 |
| EP | 0926723 A1 | 6/1999 |
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 404365558 A * | 12/1992 |
| JP | H07505982 A | 6/1995 |
| JP | 08-213427 A | 8/1996 |
| JP | 11016949 A | 1/1999 |
| JP | 11195706 A | 7/1999 |
| JP | 2000299408 A | 10/2000 |
| JP | 2001085559 A | 3/2001 |
| JP | 2001-217386 A | 8/2001 |
| JP | 2002016178 A | 1/2002 |
| JP | 2002050738 A | 2/2002 |
| JP | 03285338 B2 | 5/2002 |
| JP | 2002162212 A | 6/2002 |
| JP | 2002217331 A | 8/2002 |
| JP | 2002270718 A | 9/2002 |
| JP | 2002373957 A | 12/2002 |
| JP | 2003020404 A | 1/2003 |
| JP | 2003198069 A | 7/2003 |
| JP | 2003318178 A | 11/2003 |
| JP | 2004014657 A | 1/2004 |
| JP | 2004158537 | 6/2004 |
| JP | 2004165602 A | 6/2004 |
| JP | 2004200547 A | 7/2004 |
| JP | 2005026405 A | 1/2005 |
| JP | 2005031117 A | 2/2005 |
| JP | 2005093486 A | 4/2005 |
| JP | 2005101268 A | 4/2005 |
| JP | 2005522019 A | 7/2005 |
| JP | 2005209967 A | 8/2005 |
| JP | 2005216921 A | 8/2005 |
| JP | 2005294577 A | 10/2005 |
| JP | 2005347442 A | 12/2005 |
| JP | 2005354120 A | 12/2005 |
| JP | 2006041148 A | 2/2006 |
| JP | 2006080199 | 3/2006 |
| JP | 2006120931 A | 5/2006 |
| JP | 2006269968 | 10/2006 |
| JP | 2007005403 A | 1/2007 |
| JP | 2007-081304 | 3/2007 |
| JP | 2007053149 A | 3/2007 |
| JP | 2007096198 A | 4/2007 |
| JP | 2007157844 A | 6/2007 |
| JP | 2007227512 | 9/2007 |
| JP | 2007250712 A | 9/2007 |
| JP | 2007317887 A | 12/2007 |
| JP | 2008-085020 | 1/2008 |
| JP | 2008-091632 A | 4/2008 |
| JP | 2008147224 A | 6/2008 |
| JP | 2008147601 A | 6/2008 |
| JP | 2008-177249 A | 7/2008 |
| JP | 2008227335 A | 9/2008 |
| JP | 2008-258258 A | 10/2008 |
| JP | 2009016773 A | 1/2009 |
| JP | 2009-505401 A | 2/2009 |
| JP | 2009111367 | 5/2009 |
| JP | 2009224699 | 10/2009 |
| JP | 2010-028601 A | 2/2010 |
| JP | 2010093228 A | 4/2010 |
| JP | 2010147281 A | 7/2010 |
| JP | 2010157215 A | 7/2010 |
| JP | 2010245506 A | 10/2010 |
| KR | 19990088037 | 12/1999 |
| KR | 20040066018 A | 7/2004 |
| KR | 10-2005-0057533 | 6/2005 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| TW | 200933760 A | 8/2009 |
| TW | 201025501 A | 7/2010 |
| WO | 03/025998 A2 | 3/2003 |
| WO | 2004114397 | 12/2004 |
| WO | 2005022631 A1 | 3/2005 |
| WO | 2006004127 | 1/2006 |
| WO | 2007021639 A2 | 2/2007 |
| WO | 2008/054660 A2 | 5/2008 |
| WO | 2008108970 A2 | 9/2008 |
| WO | 2009017758 A2 | 2/2009 |
| WO | 2009023462 A1 | 2/2009 |
| WO | 2009104668 A1 | 8/2009 |
| WO | 2010104637 A1 | 9/2010 |

OTHER PUBLICATIONS

International Search Report and Written Opinion for Application No. PCT/US2011/063653 dated Aug. 13, 2012.
Japanese Office Action for Application No. 2010-519953 dated Oct. 19, 2012.
U.S. Appl. No. 12/842,612.
Partial International Search Report, PCT/US2008/002659.
International Search Report, PCT/US2008/002659.
U.S. Appl. No. 12/143,743, "Recontituted Wafer Level Stacking", filed Jun. 20, 2008.
U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report, PCT/US2008/009356.
U.S. Appl. No. 12/784,841.
U.S. Appl. No. 12/842,717.
U.S. Appl. No. 12/842,651.
U.S. Appl. No. 12/723,039.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Search Report and Written Opinion for PCT/US2011/051552 dated Apr. 11, 2012.
International Search Report and Written Opinion for PCT/US2011/051556 dated Feb. 13, 2012.
International Searching Authority, Search Report for Application No. PCT/US2011/060553 dated Jun. 27, 2012.

(56) References Cited

OTHER PUBLICATIONS

Taiwan Office Action for Application No. 100113585 dated Jun. 5, 2012.
International Search Report and Written Opinion for Application No. PCT/US2011/029394 dated Jun. 6, 2012.
Partial International Search Report for Application No. PCT/US2011/063653 dated Jul. 9, 2012.
Japanese Office Action for Application No. 2009-552696 dated Aug. 14, 2012.
David R. Lide et al: 'Handbook of Chemistry and Physics, 77th Edition, 1996-1997', Jan. 1, 1997 (Jan. 1, 1997), CRC Press, Boca Raton, New York, London, Tokyo, XP002670569, pp. 12-90-12-91.
International Search Report and Written Opinion, PCT/US2011/063025, Mar. 19, 2012.
International Search Report Application No. PCT/US2011/029568, dated Aug. 30, 2011.
International Search Report Application No. PCT/US2011/029568, dated Oct. 21, 2011.
International Written Opinion for Application No. PCT/US2011/063653 dated Jan. 14, 2013.
Chinese Office Action for Application No. 201010546793.9 dated Jun. 25, 2013.
Taiwanese Office Action for Application No. 099143374 dated Jun. 24, 2013.
Extended European Search Report for Application No. EP12189442 dated Mar. 6, 2014.
Taiwan Office Action for Application No. 100144451 dated Apr. 16, 2014.
Korean Office Action for Application No. 10-2010-7004471 dated May 29, 2014.
Taiwanese Office Action and Search Report for Application No. 100144456 dated Jul. 29, 2014.
Chinese Office Action for Application No. 201010546210.2 dated Aug. 21, 2013.
Japanese Office Action for Application No. 2009-552696 dated Nov. 1, 2013.
Preliminary Examination Report from Taiwan Application No. 099140226 dated Oct. 21, 2013.
Taiwanese Office Action for Application No. 100133520 dated Dec. 12, 2013.
Office Action for Taiwan Application No. 100145366 dated Nov. 21, 2014.
Taiwanese Office Action for Application No. 100144452 dated Oct. 17, 2014.
Japanese Office Action for Application No. 2013-538966 dated Sep. 18, 2015.
Chinese Office Action for Application No. 2013100226268 dated Feb. 4, 2015.
Japanese Office Action for Application 2013-541978 dated Feb. 24, 2015.
Japanese Office Action for Application No. 2014-146474 dated. Apr. 24, 2015.

\* cited by examiner

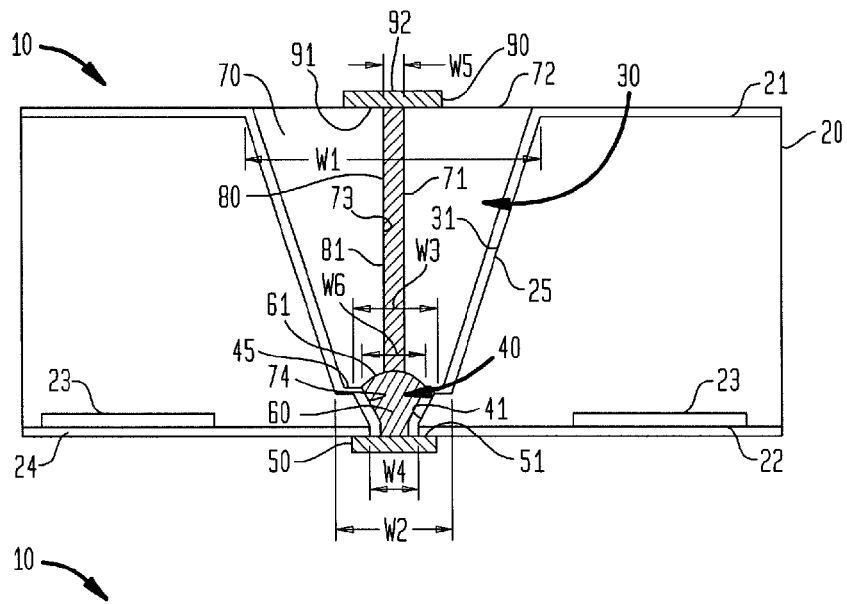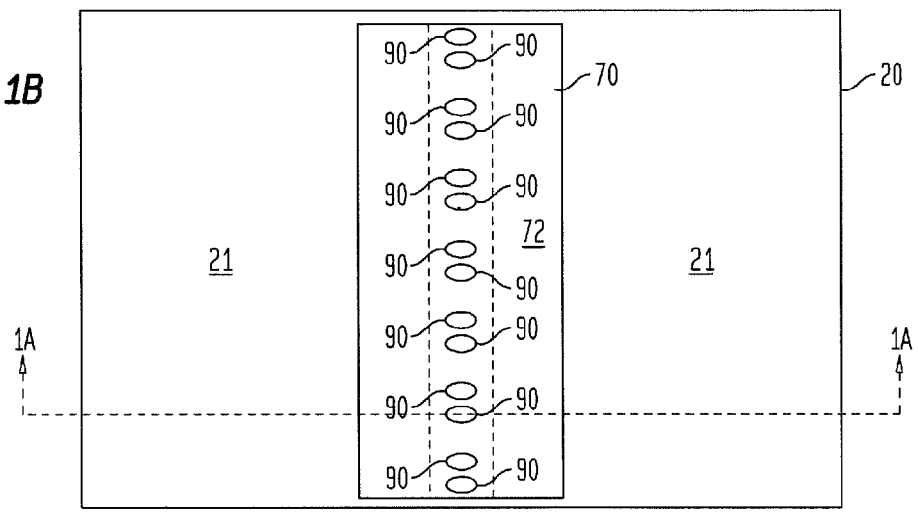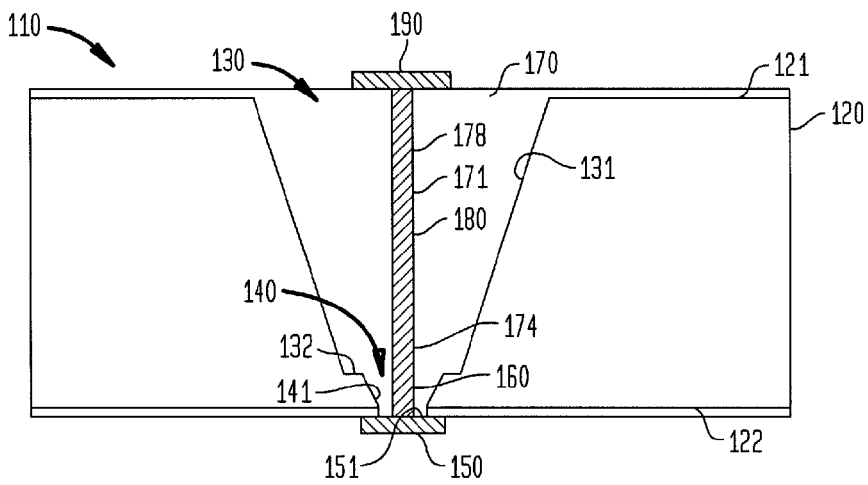

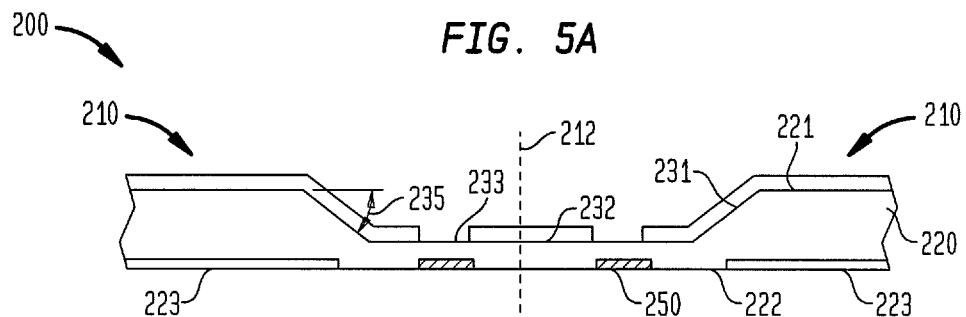
FIG. 5A
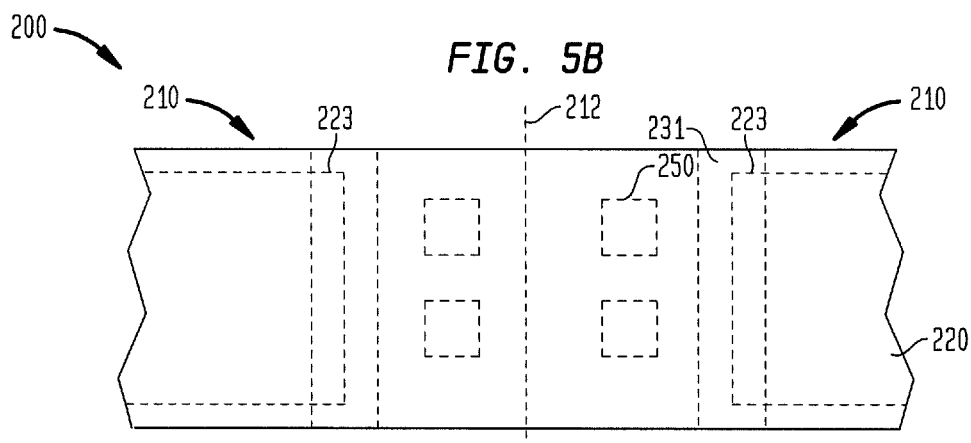
FIG. 5B
FIG. 6
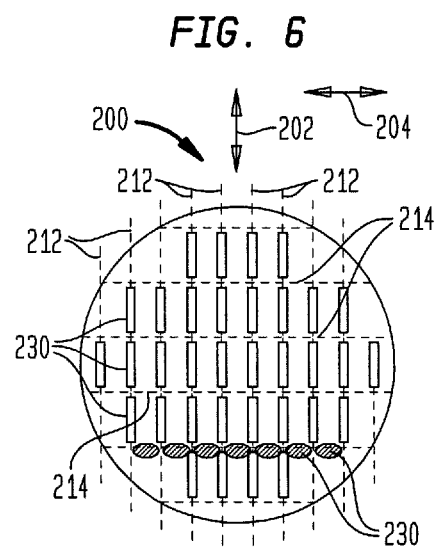
FIG. 7
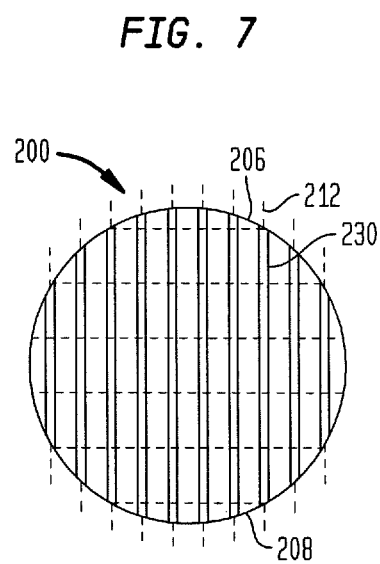

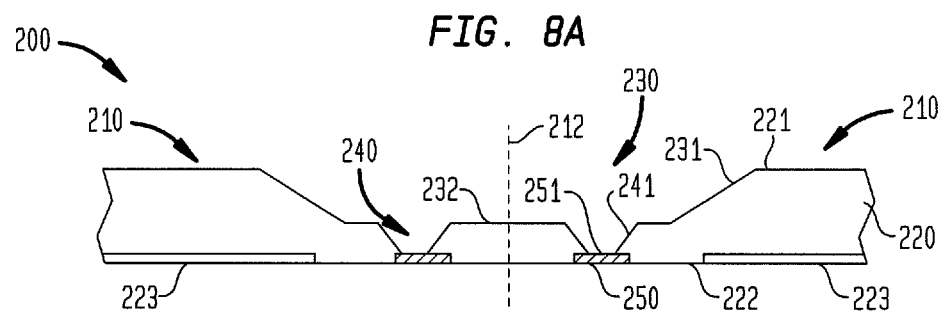
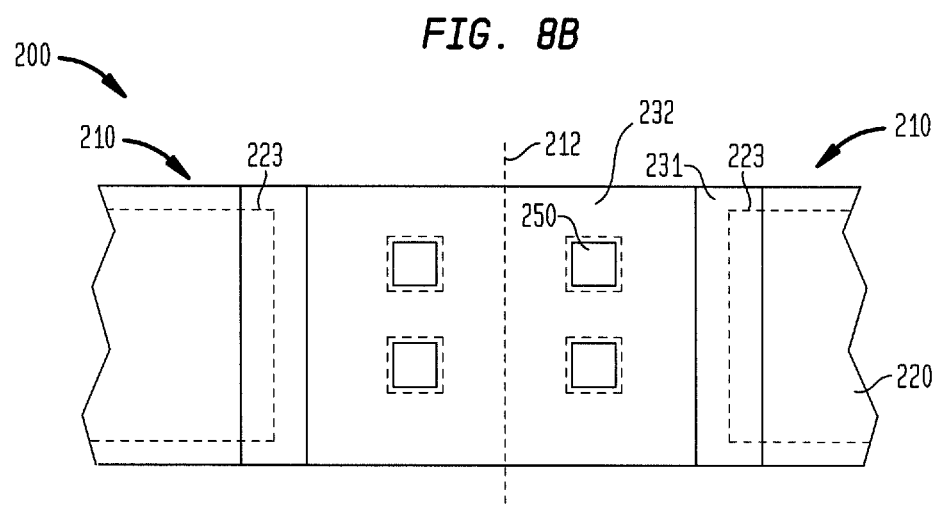
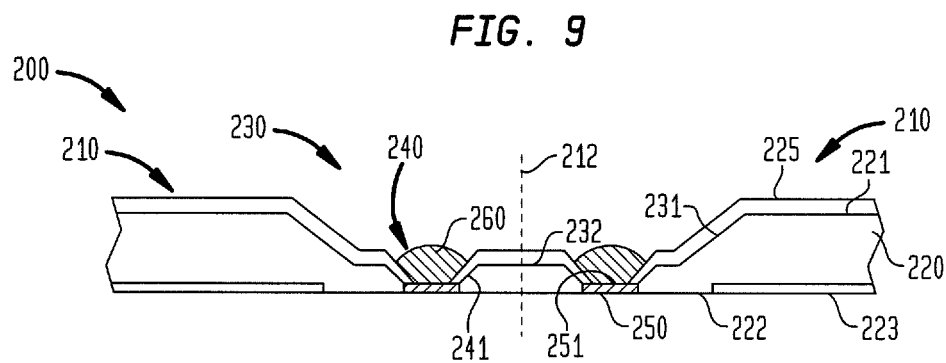

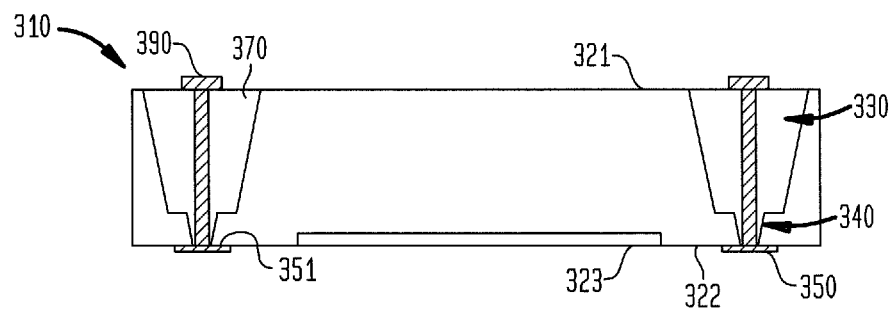
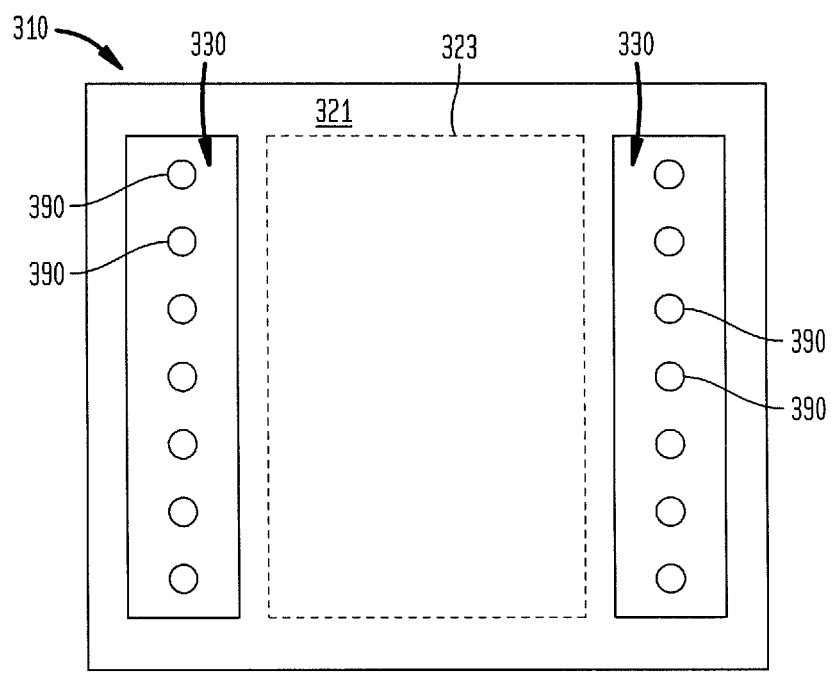

METHODS OF FORMING SEMICONDUCTOR ELEMENTS USING MICRO-ABRASIVE PARTICLE STREAM

BACKGROUND OF THE INVENTION

The present invention relates to packaging of microelectronic devices, especially the packaging of semiconductor devices.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, gold, or aluminum, around 0.5 μm thick. The size of the bond pads will vary with the device type but will typically measure tens to hundreds of microns on a side.

Through-silicon vias (TSVs) are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip. Also, conventional methods of forming TSV holes, e.g., wet etching, can be relatively time consuming and expensive, especially when a tight tolerance for the size of a hole at the first face is required.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, there is still a need for improvements in order to minimize the size of semiconductor chips, while enhancing electrical interconnection reliability. These attributes of the present invention are achieved by the construction of the microelectronic packages and methods of making the microelectronic packages as described hereinafter.

SUMMARY OF THE INVENTION

In accordance with an aspect of the invention, a method of fabricating a microelectronic unit includes the step of providing a semiconductor element having a front surface and a rear surface remote from the front surface. The semiconductor element can include a plurality of active semiconductor devices therein. The semiconductor element can include a plurality of conductive pads exposed at the front surface.

The method of fabricating a microelectronic unit can also include the step of forming at least one first opening extending from the rear surface partially through the semiconductor element towards the front surface by directing a jet of fine abrasive particles towards the semiconductor element. The method can also include the step of forming at least one conductive contact and at least one conductive interconnect coupled thereto. Each conductive interconnect can extend within one or more of the first openings and can be coupled directly or indirectly to at least one of the conductive pads. Each of the conductive contacts can be exposed at the rear surface of the semiconductor element for electrical connection to an external device.

In an exemplary embodiment, at least one of the plurality of conductive pads can be electrically connected to at least one of the plurality of active semiconductor devices. In one embodiment, the at least one conductive contact can overlie the rear surface of the semiconductor element. In a particular embodiment, an average size of the fine abrasive particles can be at least 1 micrometer. In one embodiment, the jet of fine abrasive particles can include a gas medium. In an exemplary embodiment, the jet of fine abrasive particles can include a liquid medium. In a particular embodiment, the first opening can have a first width in a lateral direction along the rear surface, and at least one of the conductive contacts can have a second width in the lateral direction, the first width being greater than the second width.

In one embodiment, the step of forming the first opening can include forming a channel shape. In an exemplary embodiment, the method of fabricating a microelectronic unit can also include the step of smoothing an inner surface of the first opening after forming the first opening. In a particular embodiment, the step of smoothing an inner surface of the first opening can include using wet etching or plasma etching. In one embodiment, the conductive interconnect can have a cylindrical or frusto-conical shape. In an exemplary embodiment, the conductive interconnect can include an internal space. The method can also include the step of filling the internal space with a dielectric material.

In an exemplary embodiment, the conductive pads can have top surfaces exposed at the front surface of the semiconductor element and bottom surfaces remote therefrom. In one embodiment, the method of fabricating a microelectronic unit can also include the step of forming at least one second opening extending from one or more of the first openings to the bottom surface of at least one of the conductive pads. The method can also include the step of forming at least one conductive via extending within the at least one second opening and coupled to the respective one of the pads. The step of forming the at least one conductive interconnect can be performed after forming the conductive via, such that the conductive interconnect is coupled to the conductive pad through the at least one conductive via.

In one embodiment, the step of forming the at least one second opening can include forming at least two second openings extending from one of the first openings towards the bottom surface of respective ones of the conductive pads. In an exemplary embodiment, the step of forming the at least one conductive interconnect can form two or more conductive interconnects at least within the first opening extending to two or more respective ones of the at least one conductive vias. In a particular embodiment, the method can also include the step of forming a dielectric region within the first opening and forming an aperture with a laser penetrating through the dielectric region. In an exemplary embodiment, the step of forming the at least one conductive interconnect can form the conductive interconnect at least within the aperture.

In a particular embodiment, the step of forming a conductive interconnect can include plating an inner surface of the aperture. In one embodiment, the method can also in clue the step of from within the second opening, removing at least a portion of a passivation layer contacting the bottom surface of the pad. The method can also include the step of forming a dielectric layer coating the second opening. In a particular embodiment, the second dielectric layer can be deposited by electrochemical polymer deposition. In one embodiment, the step of forming the dielectric layer can include coating a surface having a negative angle with respect to the rear surface. In an exemplary embodiment, the step of forming at least one conductive via can include plating an inner surface of the second opening. The step of forming a conductive interconnect can include plating an inner surface of the first opening.

In an exemplary embodiment, the conductive pads can have top surfaces exposed at the front surface of the semiconductor element and bottom surfaces remote therefrom. The method can also include the step of forming at least one second opening extending from one or more of the first openings to at least the bottom surface of at least one of the conductive pads. The step of forming the at least one conductive interconnect can form the conductive interconnect at least within the second opening extending to the conductive pad.

In one embodiment, the step of forming the at least one second opening can include forming at least two second openings extending from one of the first openings towards the bottom surface of respective ones of the conductive pads. In a particular embodiment, the step of forming the at least one conductive interconnect can form two or more conductive interconnects at least within two or more respective ones of the at least one second openings. The method can also include the step of from within the second opening, removing at least a portion of a passivation layer contacting the bottom surface of the pad.

In a particular embodiment, the method of fabricating a microelectronic unit can also include the steps of forming a dielectric region within the first opening and the second opening and forming an aperture with a laser penetrating through the dielectric region and through the first opening and one of the at least one second opening. The step of forming the at least one conductive interconnect can form the conductive interconnect at least within the aperture. The step of forming the dielectric region can include coating a surface having a negative angle with respect to the rear surface. The step of forming a conductive interconnect can include plating an inner surface of the aperture.

In accordance with an aspect of the invention, a method of fabricating an interconnection substrate can include the step of providing a semiconductor element having a front surface and a rear surface remote from the front surface. The method can also include the step of forming at least one first opening extending from the rear surface partially through the semiconductor element towards the front surface by directing a jet of fine abrasive particles towards the semiconductor element. The method can also include the step of forming at least one conductive contact, at least one conductive interconnect coupled thereto, and at least one conductive pad exposed at the front surface. Each conductive interconnect can extend within one or more of the first openings and can be coupled directly or indirectly to at least one of the conductive pads. Each of the conductive contacts can be exposed at the rear surface of the semiconductor element for electrical connection to an external device.

In a particular embodiment, the at least one conductive contact can overlie the rear surface of the semiconductor element. In a particular embodiment, an average size of the fine abrasive particles can be at least 1 micrometer. In one embodiment, the jet of fine abrasive particles can include a gas medium. In an exemplary embodiment, the jet of fine abrasive particles can include a liquid medium. In a particular embodiment, the first opening can have a first width in a lateral direction along the rear surface, and at least one of the conductive contacts can have a second width in the lateral direction, the first width being greater than the second width.

In one embodiment, the step of forming the first opening can include forming a channel shape. In an exemplary embodiment, the method of fabricating a microelectronic unit can also include the step of smoothing an inner surface of the first opening after forming the first opening. In a particular embodiment, the step of smoothing an inner surface of the first opening can include using wet etching or plasma etching. In one embodiment, the conductive interconnect can have a cylindrical or frusto-conical shape. In one embodiment the semiconductor element can also include a passivation layer coating the front surface thereof. The method can also include the step of removing a portion of the passivation layer by directing a jet of fine abrasive particles towards the semiconductor element. In an exemplary embodiment, the conductive interconnect can include an internal space. The method can also include the step of forming a dielectric material within the internal space.

In an exemplary embodiment, the conductive pads can have top surfaces exposed at the front surface of the semiconductor element and bottom surfaces remote therefrom. The method can also include the step of forming at least one conductive via extending within the at least one second opening and coupled directly or indirectly to a respective one of the pads. The step of forming the at least one conductive interconnect can be performed after forming the conductive via, such that the conductive interconnect is coupled to the conductive pad through the at least one conductive via.

In a particular embodiment, the step of forming the at least one second opening can include forming at least two second openings extending from one of the first openings towards the front surface of the semiconductor element. In one embodiment, the step of forming the at least one conductive interconnect can form two or more conductive interconnects at least within the first opening extending to two or more respective ones of the at least one conductive vias. In an exemplary embodiment, the method can also include the steps of forming a dielectric region within the first opening and forming an aperture with a laser penetrating through the dielectric region. The step of forming the at least one conductive interconnect can form the conductive interconnect at least within the aperture.

In one embodiment, the step of forming a conductive interconnect can include plating an inner surface of the aperture. In an exemplary embodiment, the method can also include the step of forming a dielectric layer coating the second opening. In a particular embodiment, the step of forming at least one conductive via can include plating an inner surface of the second opening. The step of forming a conductive interconnect can include plating an inner surface of the first opening. In one embodiment, one or more of the conductive pads can be coupled to one or more of the conductive vias through traces extending along the front surface of the semiconductor element.

In an exemplary embodiment, the conductive pads can have top surfaces exposed at the front surface of the semiconductor element and bottom surfaces remote therefrom. The method can also include the step of forming at least one second opening extending from one or more of the first openings to the front surface of the semiconductor element. The step of forming the at least one conductive interconnect can form the conductive interconnect at least within the second opening extending to a respective one of the conductive pads.

In a particular embodiment, the step of forming the at least one second opening can include forming at least two second openings extending from one of the first openings towards the front surface of the semiconductor element. In one embodiment, the step of forming the at least one conductive interconnect can form two or more conductive interconnects at least within two or more respective ones of the at least one second openings. In an exemplary embodiment, the method can also include the steps of forming a dielectric region within the first opening and the second opening and forming an aperture with a laser penetrating through the dielectric region and through the first opening and one of the at least one second opening. The step of forming the at least one conductive interconnect can form the conductive interconnect at least within the aperture. In one embodiment, the step of forming a conductive interconnect can include plating an inner surface of the aperture.

In accordance with an aspect of the invention, a microelectronic unit includes a semiconductor element having a front surface and a rear surface remote from the front surface. The semiconductor element can have a plurality of active semiconductor devices therein. The semiconductor element can have a plurality of conductive pads. Each pad can have a top surface exposed at the front surface and a bottom surface remote from the top surface. The semiconductor element can have a first opening extending from the rear surface partially through the semiconductor element towards the front surface and at least one second opening. Each second opening can extend from the first opening to at least the bottom surface of a respective one of the pads.

The microelectronic unit can also include at least one conductive via extending within a respective one of the at least one second opening and being electrically connected with the respective pad. The microelectronic unit can also include at least one conductive interconnect. Each conductive interconnect can be electrically connected to a respective one of the at least one conductive via and can extend away therefrom within at least the first opening.

The microelectronic unit can also include at least one conductive contact. Each conductive contact can be electrically connected to a respective one of the conductive interconnects. The at least one conductive contact can be exposed at an exterior of the semiconductor element. The first opening can define an inner surface that has a surface roughness of greater than 1 micron. The inner surface can define a wall angle of 60 to 100 degrees relative to the rear surface.

In one embodiment, a single active semiconductor region can contain the plurality of active semiconductor devices. In an exemplary embodiment, each of a plurality of active semiconductor regions can contain a portion of the plurality of active semiconductor devices. In a particular embodiment, the second opening can define an inner surface that has a negative angle with respect to the rear surface. In one embodiment, the first opening can have a first width in a lateral direction along the rear surface, and at least one of the conductive contacts can have a second width in the lateral direction along the rear surface, the first width being greater than the second width.

In an exemplary embodiment, the at least one second opening can be a plurality of second openings. The at least one conductive via can be a plurality of conductive vias. The at least one conductive interconnect can be a plurality of conductive interconnects. The at least one conductive contact can be a plurality of conductive contacts. In one embodiment, the first opening can define a channel shape. The plurality of second openings can extend from the first opening to at least the bottom surface of respective pads. In a particular embodiment, each conductive contact can be adapted to be moveable relative to the microelectronic element when a lateral force is applied to the respective pad or contact.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIGS. 1A and 1B are a sectional view and a corresponding top-down plan view illustrating a via structure in accordance with an embodiment of the invention.

FIG. 2 is a sectional view illustrating a via structure in accordance with another embodiment.

FIGS. 5A and 5B are a sectional view and a corresponding top-down plan view illustrating a stage of fabrication in accordance with an embodiment of the invention.

FIG. 6 is a plan view illustrating a stage of fabrication in accordance with an embodiment of the invention.

FIG. 7 is a plan view illustrating a stage of fabrication in accordance with an alternative embodiment of the invention.

FIGS. 8A and 8B are a sectional view and a corresponding top-down plan view illustrating a stage of fabrication in accordance with an embodiment of the invention.

FIG. 9 is a sectional view illustrating a stage in a method of fabrication in accordance with an embodiment of the invention.

FIG. 12A is a sectional view illustrating a packaged chip in accordance with another embodiment.

FIG. 12B is a plan view further illustrating the packaged chip shown in FIG. 12A.

DETAILED DESCRIPTION

Figure 3A:
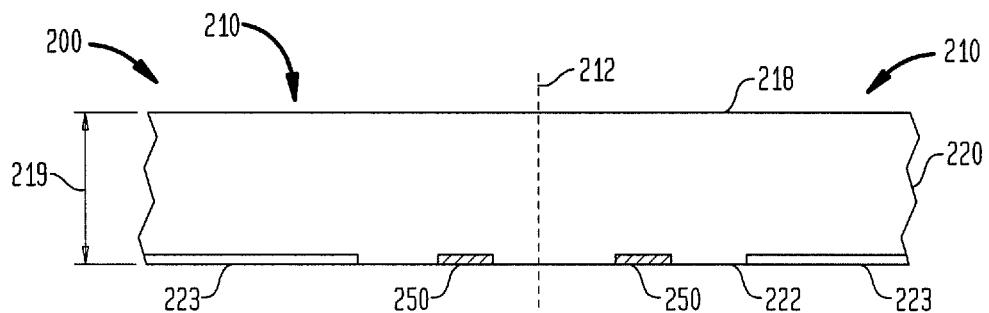
FIGS. 3A and 3B are a sectional view and a corresponding top-down plan view illustrating a stage of fabrication in accordance with an embodiment of the invention.

In the embodiments shown and described herein, some or all of the openings in the semiconductor element are formed by directing a jet of fine abrasive particles onto a surface of the semiconductor element. The fine abrasive particles remove material exposed at the surface. As used herein, sandblasting means this process, whether or not the abrasive particles include sand or silicon dioxide particles, a main component of sand. Use of sandblasting to form some of the openings in a semiconductor element can reduce the time and cost of producing microelectronic units, while still permitting tight opening tolerances at the active face of a semiconductor element.

FIGS. 1A and 1B are a sectional view and a corresponding top-down plan view illustrating an example via structure that can be formed in accordance with an embodiment of the invention. In the embodiment shown in FIGS. 1A and 1B, sandblasting can be used to form one or more of the openings in the semiconductor element. More details concerning the formation of the microelectronic unit shown in FIGS. 1A and 1B is provided below with reference to FIGS. 3A through 11B.

As illustrated in FIGS. 1A and 1B, a microelectronic unit 10 includes a semiconductor element 20 having a first opening 30 extending from a rear surface 21 partially through the semiconductor element 20 towards a front surface 22 and a second opening 40 extending from the first opening 30 to a bottom surface of a conductive pad 50, a conductive via 60 extending within the second opening 40, a dielectric region 70 overlying an inner surface 31 in the first opening 30, a conductive interconnect 80 extending within the first opening 30, and a conductive contact 90 electrically connected to the conductive interconnect 80. The conductive contact 90 can overlie an inner surface 31 of the first opening and may wholly overlie the inner surface 31 or a lower surface 45 or both. In one example, the conductive contact 90 can overlie the rear surface 21 of the semiconductor element 20, which, as used herein, means that the conductive contact can overlie any portion of the rear surface, including overlying a dielectric region filling the first opening.

The semiconductor element 20 can include a semiconductor substrate, which can be made from silicon, for example. A plurality of active semiconductor devices (e.g., transistors, diodes, etc.) can be disposed in an active semiconductor region 23 thereof located at and/or below the front surface 22. The thickness of the semiconductor element between the front surface 22 and the rear surface 21 typically is less than 200 μm, and can be significantly smaller, for example, 130 μm, 70 μm or even smaller.

The semiconductor element 20 can further include a dielectric layer 24 located between the front surface 22 and the conductive pad 50. The dielectric layer 24 electrically insulates the conductive pad 50 from the semiconductor element 20. This dielectric layer 24 can be referred to as a "passivation layer" of the microelectronic unit 10. The dielectric layer 24 can include an inorganic or organic dielectric material or both. The dielectric layer 24 may include an electrodeposited conformal coating or other dielectric material, for example, a photoimageable polymeric material, for example, a solder mask material. In a particular example, a portion of the passivation layer can be removed from a bottom surface 51 of the conductive pad 50 so that a conductive element (e.g., the conductive via 60) can be coupled to the bottom surface. In one example, a portion of the passivation layer can be removed from the front surface 22 by directing a jet of fine abrasive particles towards the semiconductor element 20.

The first opening 30 extends from the rear surface 21 partially through the semiconductor element 20 towards the front surface 22. The first opening 30 can be formed by directing a jet of fine abrasive particles towards the semiconductor element 20 (i.e., sandblasting). The first opening 30 includes inner surface 31 that extend from the rear surface 21 through the semiconductor element 20 at an angle between 0 and 90 degrees to the horizontal plane defined by the rear surface 21. The inner surface 31 can have a constant slope or a varying slope. For example, the angle or slope of the inner surface 31 relative to the horizontal plane defined by the rear surface 21 can decrease in magnitude (i.e., become less positive or less negative) as the inner surface 31 penetrates further towards the front surface 22.

As shown in FIG. 1A, the first opening 30 has a width W1 at the rear surface 21 and a width W2 at the lower surface 45 that is less than W1 such that the first opening is tapered in a direction from the rear surface towards the lower surface. In other examples, the first opening can have a constant width, or the first opening can be tapered in a direction from the lower surface towards the rear surface.

The first opening 30 may extend more than half-way from the rear surface 21 towards the front surface 22, such that a height of the first opening 30 in a direction perpendicular to the rear surface 21 is greater than a height of the second opening 40.

The first opening 30 can have any top-view shape, including for example, a rectangular channel with a plurality of second openings 40, as shown in FIG. 1B. In one embodiment, such as in the interposer embodiment shown in FIG. 19, the first opening 30 can have a round top-view shape. In the embodiment shown in FIG. 1B, first opening 30 has a width in a first lateral direction along the rear surface 21, and the first opening 30 has a length in a second lateral direction along the rear surface 21 transverse to the first lateral direction, the length being greater than the width.

The second opening 40 can extend from the first opening 30 to the bottom surface 51 of the conductive pad 50. The second opening 40 can be formed, for example, by wet etching. As shown in FIG. 1A, the second opening 40 has a width W3 at the lower surface 45 of the first opening 30 and a width W4 at the bottom surface 51 of the conductive pad 50 such that the second opening is tapered in a direction from the first opening towards the bottom surface of the conductive pad.

Figure 16:
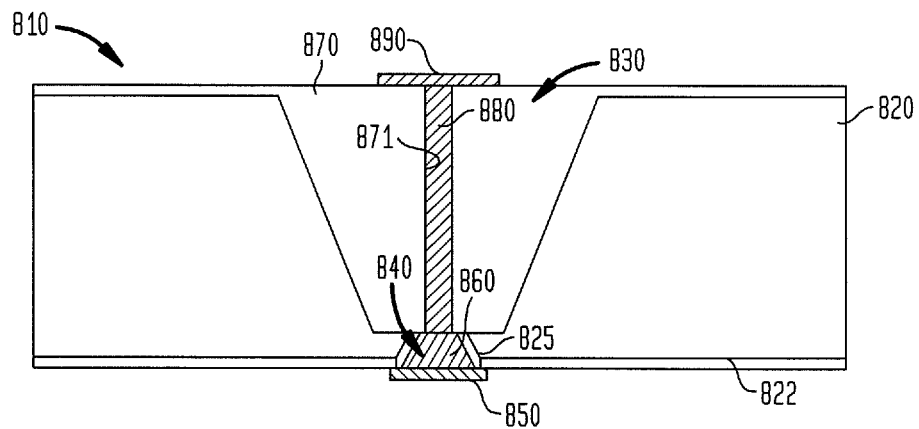
FIG. 16 is a sectional view illustrating an interposer via structure in accordance with an embodiment of the invention.
Figure 17:
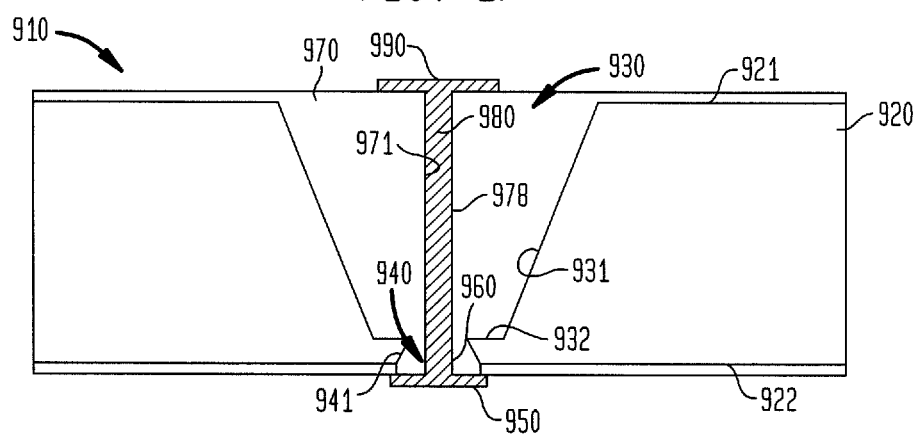
FIG. 17 is a sectional view illustrating an interposer via structure in accordance with an alternate embodiment.
Figure 18:
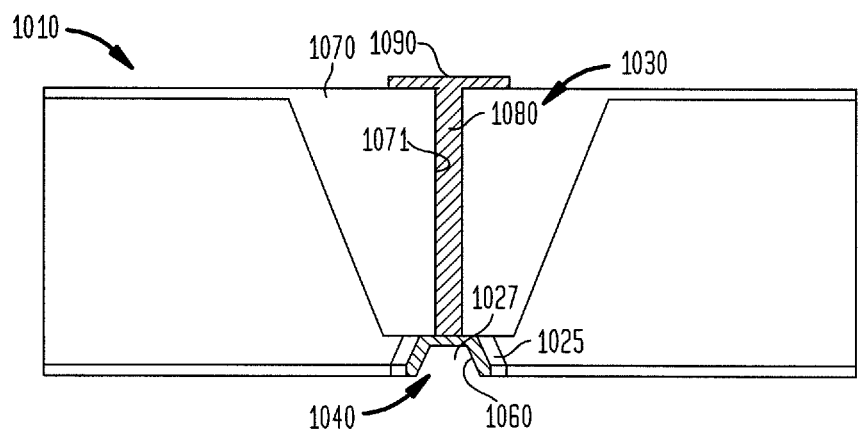
FIG. 18 is a sectional view illustrating an interposer via structure in accordance with another alternate embodiment.

In other examples, the second opening can have a constant width, or the second opening can be tapered in a direction from the front surface towards the first opening (e.g., such as in the interposer embodiments shown in FIGS. 16-18). In such interposer embodiments, the second opening 40 can be formed by sandblasting.

The inner surface 41 can have a constant slope or a varying slope. For example, the angle or slope of the inner surface 41 relative to the horizontal plane defined by the rear surface 21 can decrease in magnitude (i.e., become less positive or less negative) as the inner surface 41 penetrates further from the bottom surface 51 of the conductive pad 50 towards the rear surface 21.

The second opening 40 can extend less than half-way from the bottom surface 51 of the conductive pad 50 towards the front surface 22, such that a height of the second opening 40 in a direction perpendicular to the rear surface 21 is less than a height of the first opening 30.

The second opening 40 can have any top-view shape, including for example, a round shape, as shown in FIG. 1B. In one embodiment, such as in the embodiment shown in FIGS. 8A through 11B, the second opening 40 can have a square, rectangular, or other angular top-view shape.

Any number of second openings 40 can extend from a single first opening 30, and the second openings 40 can be arranged in any geometric configuration within a single first opening 30. For example, fourteen second openings 40 can arranged along a common axis, as shown in FIG. 1B, or seven second openings 40 can be arranged along a common axis, as shown in FIG. 12B. In one embodiment, such as in the embodiment shown in FIGS. 8A through 11B, there can be four second openings 40 arranged in two parallel rows. In another embodiment, such as in the embodiment shown in FIGS. 22A and 22B, there can be four second openings 40 arranged in a cluster. In yet another embodiment, such as in the embodiment shown in FIG. 20B, there can be two parallel rows of second openings 40 extending from a single channel-shaped first opening 30. Particular examples of various first and second opening configurations and methods of forming these configurations are described in the herein incorporated commonly owned U.S. Patent Application Publication No. 2008/0246136.

As seen in FIGS. 1A and 1B, the semiconductor element 20 includes one or more conductive pads 50 exposed at the front surface 22 of the semiconductor element 20. While not specifically shown in FIGS. 1A and 1B, the active semiconductor devices in the active semiconductor region 23 typically are conductively connected to the front conductive pads 50. The active semiconductor devices, thus, are accessible conductively through wiring incorporated extending within or above one or more dielectric layers of the semiconductor element 20. In some embodiments, the contact pads may not be directly exposed at the front surface of the semiconductor element. Instead, the contact pads may be electrically connected to traces extending to terminals that are exposed at the front surface of the semiconductor element. The conductive pads 50 can be made from any electrically conductive metal, including for example, copper or gold.

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric. Similarly, a statement that an electrically conductive element is "exposed at" a surface of a semiconductor element indicates that the electrically conductive element is available for contact with a theoretical point moving in a direction perpendicular to the surface of the semiconductor element from outside the dielectric element. A terminal or other conductive element which is exposed at a surface of a semiconductor element may project from such surface; may be flush with such surface; or may be recessed relative to such surface and be exposed through an opening, hole or depression in the semiconductor element.

While essentially any technique usable for forming conductive elements can be used to form the conductive elements described herein, non-lithographic techniques as discussed in greater detail in the co-pending, commonly assigned U.S. patent application Ser. No. 12/842,669, filed Jul. 23, 2010, can be employed. Such non-lithographic techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

The conductive via 60 extends within the second opening 40 and is electrically connected with the conductive pad 50 and the conductive interconnect 80. The conductive via contacts the bottom surface 51 of the conductive pad 50. The conductive pad 50 at least partially overlies the conductive via 60.

As shown in FIG. 1A, the conductive via 60 can fill all of the volume within the second opening 40 inside of a dielectric layer 25 that electrically insulates the semiconductor element 20 from the conductive via 60. In other words, a second aperture 74 extending within the dielectric layer 25 within the second opening 40 conforms to a contour of the second opening 40, and the conductive via 60 conforms to the contour of the second opening 40.

In other embodiments, such as that shown in FIG. 2, the conductive via portion of a conductive interconnect that is located inside within the second opening may have a cylindrical or frusto-conical shape. The conductive via 60 can be made from a metal or an electrically conductive compound of a metal, including for example, copper or gold.

The dielectric region 70 (and the dielectric layer 25) can provide good dielectric isolation with respect to the semiconductor element 20. The dielectric layer 25 can be deposited, for example, by electrolytic polymer deposition.

The dielectric region 70 can be compliant, having a sufficiently low modulus of elasticity and sufficient thickness such that the product of the modulus and the thickness provide compliancy. Specifically, such a compliant dielectric region 70 can allow the conductive interconnect 80 and the conductive contact 90 attached thereto to flex or move somewhat relative to the semiconductor element 20 when an external load is applied to the conductive contact 90. In that way, the bond between the conductive contacts 90 of the microelectronic unit 10 and terminals of a circuit panel (not shown) can better withstand thermal strain due to mismatch of the coefficient of thermal expansion ("CTE") between the microelectronic unit 10 and the circuit panel.

In the embodiments shown, an outer surface 72 of the dielectric region 70 is located within a plane defined by the rear surface 21 of the semiconductor element 20. In other embodiments (not shown), the outer surface 72 of the dielectric region 70 can extend above a plane defined by the rear surface 21 of the semiconductor element 20.

A first aperture 71 is provided in the dielectric region 70. The first aperture 71 has a cylindrical shape and extends through the dielectric region 70 from a bottom surface 91 of the conductive contact 90 to the conductive via 60. In other embodiments (not shown), the first aperture 71 can have other shapes, including for example, a frusto-conical shape or a combination of a cylindrical and a frusto-conical shape at different distances from the rear surface 21. In the embodiments shown, a contour of the first aperture 71 (i.e., the shape of the outer surface of the first aperture 71) does not conform to a contour of the first opening 30 (i.e., the shape of the inner surface 31 of the first opening 30).

The conductive interconnect 80 extends within the first opening 30 inside the first aperture 71 and is electrically connected with the conductive via 60 and the conductive contact 90. As shown in FIG. 1A, the conductive interconnect 80 has a cylindrical shape. In other embodiments (not shown), the conductive interconnect 80 can have other shapes, including for example, a frusto-conical shape or a combination of a cylindrical and a frusto-conical shape at different distances from the rear surface 21. In the embodiments shown, a contour of the conductive interconnect 80 (i.e., the shape of the outer surface of the conductive interconnect 80) does not conform to a contour of the first opening 30 (i.e., the shape of the inner surface 31 of the first opening 30). The conductive interconnect 80 can be made from any electrically conductive metal, including for example, copper or gold.

As shown in FIG. 1A, the conductive interconnect 80 is solid. In other embodiments (not shown), the conductive interconnect can include an internal space that is filled with a dielectric material. For example, the conductive interconnect 80 can be formed by plating an inner surface 73 of the first aperture 71 that extends through the dielectric region 70, thereby producing a conductive layer overlying the inner surface 73 of the first aperture 71. The conductive interconnect 80 can be formed either solid or hollow depending upon the process conditions. Under appropriate process conditions, a conductive interconnect that includes an internal space can be produced, and that internal space can then be filled with a dielectric material, whereby a dielectric layer overlies the conductive layer within the first aperture 71.

As shown in FIG. 1A, the conductive interconnect 80 and the conductive via 60 can have different shapes, wherein the outer surface 81 of the conductive interconnect 80 has a slope discontinuity at the transition point to an upper surface 61 of the conductive via 60. In other words, a width W5 of the first aperture 71 within the first opening 30 defines a step change relative to a width W6 of a second aperture 74 within the second opening 40 where the first and second apertures meet.

The conductive contact 90 is exposed at the outer surface 72 of the dielectric region 70 for interconnection to an external element. The conductive contact 90 is electrically connected to the conductive interconnect 80 at the bottom surface 91 thereof.

The conductive contact 90 can be aligned with the first opening 30 and can be disposed wholly or partly within an area of the semiconductor element 20 defined by the first opening 30. As seen in FIG. 1A, the conductive contact 90 is wholly disposed within an area defined by the first opening 30. A plane defined by a top surface 92 of the conductive contact 90 is substantially parallel to the plane defined by the rear surface 21 of the semiconductor element 20.

As shown, the bottom surface 91 of the conductive contact 90 is located above the plane defined by the rear surface 21 of the semiconductor element 20. In other embodiments, the bottom surface 91 of the conductive contact 90 can be located at or below the plane defined by the rear surface 21.

As shown, the conductive contact 90 has the shape of a conductive bond pad, e.g., a thin flat member. In other embodiments, the conductive contact can be any other type of conductive contact, including for example, a conductive post.

As shown, the first opening 30 has a first width in a lateral direction along the rear surface 21, and at least one of the conductive contacts 90 has a second width in the lateral direction, the first width being greater than the second width.

In some embodiments, conductive bond material can be exposed at a surface of the conductive contact 90 for interconnection to an external element.

Reference is now made to FIG. 2, which illustrates a sectional view of a via structure in accordance with another embodiment. The microelectronic unit 110 is similar to the microelectronic unit 10 described above, but the microelectronic unit 110 differs in the structure of the dielectric region and in the configuration of the electrical connection between the conductive pad and the conductive contact.

Rather than having a separate conductive interconnect and conductive via, the microelectronic unit 110 includes a single unitary conductive interconnect 178 extending between the conductive pad 150 and the conductive contact 190. The conductive interconnect 178 includes a conductive interconnect portion 180 extending from the conductive contact 190 through the first opening 130 and a conductive via portion 160 extending from the conductive pad 150 through the second opening 140.

In one embodiment, the microelectronic unit 110 can include a single unitary dielectric region 170 coating the inner surface 131 of the first opening 130, the inner surface 141 of the second opening 140, and the rear surface 121 of the semiconductor element 120. The dielectric region 170 can also fill a space between the inner surfaces 131 and 141 and the conductive interconnect 178. Alternatively, the dielectric region 170 can include two or more layers of material.

To form the single conductive interconnect 178, the dielectric region 170 is applied inside of the first opening 130 and the second opening 140, an aperture 171 is created extending through the dielectric region 170 to a bottom surface 151 of the conductive pad 150, for example via laser ablation or mechanical drilling, and the aperture 171 is plated with a conductive metal such as copper or gold. Similar to the conductive interconnect 80 shown in FIG. 1A, the conductive interconnect 178 may be solid or may contain an internal space that is filled with a dielectric material.

In the embodiment shown in FIG. 2, a portion 174 of the aperture 171 extending within the dielectric region 170 within the second opening 140 does not conform to a contour of the second opening 140 and the conductive via 160 does not conform to the contour of the second opening 140.

Referring to FIG. 3A, microelectronic units 210 can be processed simultaneously by wafer-level processing, i.e., by processing performed simultaneously to a plurality of microelectronic units 210 while they remain joined together as a portion of a wafer or as an entire semiconductor device wafer. After reaching a stage of fabrication illustrated in FIG. 11A for example, the wafer can be severed along dicing lane 212 and other dicing lanes not visible within the view of FIG. 3A into individual packaged microelectronic units 210.

A method of simultaneously fabricating a plurality of microelectronic units 210 (FIG. 11A) will now be described, with reference to FIGS. 3A through 11B. In the embodiment shown in FIGS. 3A through 11B, sandblasting can be used to form one or more of the openings in the semiconductor element. As illustrated in FIG. 3A, a semiconductor device wafer 200 or portion of a device wafer 200 contains a plurality of microelectronic units 210. Each microelectronic unit 210 includes a semiconductor element 220 having one or more active semiconductor regions 223 and conductive pads 250.

Dicing lane 212 indicates a location of a dicing lane at a boundary between individual microelectronic units 210. Dicing lanes 212 of the device wafer 200 need not be very wide. The locations of conductive pads 250 of the microelectronic units 210 can be spaced apart from the dicing lanes. A representative width of the dicing lane 212 is approximately 40 µm (microns).

Figure 3B:
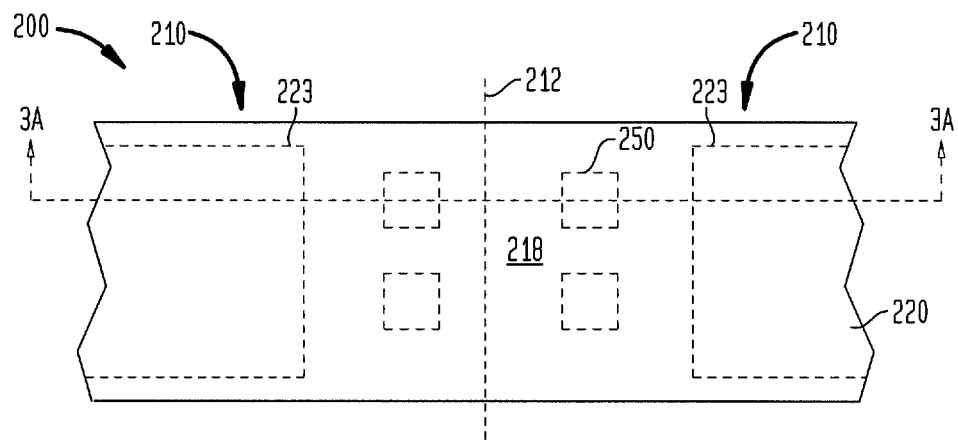

As illustrated in plan view in FIG. 3B, an initial rear surface 218 of the microelectronic units 210 overlies the front surface 222 of the microelectronic units 210. Desirably, at this stage of fabrication, the initial rear surface 218 is spaced uniformly from the front surface 222 of the microelectronic unit 210 by an initial thickness 219 of the device wafer 200. Locations of the conductive pads 250 underlying the device wafer 200 and dicing lane 212 are indicated in a FIG. 3B looking toward the initial rear surface 218 of the device wafer 200.

Figure 4:
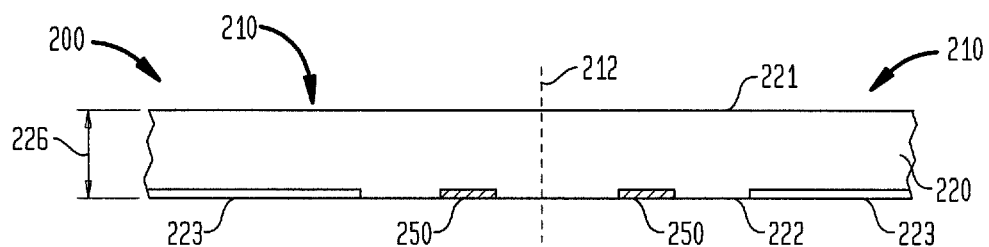
FIG. 4 is a sectional view illustrating a stage in a method of fabrication in accordance with an embodiment of the invention.

During processing, the thickness of the device wafer 200 between the front surface 222 and the initial rear surface 218 can be reduced. Grinding, lapping, or polishing from the initial rear surface 218 or a combination thereof can be used to reduce the thickness. During this step, as an example, the initial thickness 219 of the device wafer 200 can be reduced from about 700 µm to a thickness 226 of about 130 µm or less (FIG. 4).

Then, as shown in FIG. 5A, a first opening 230 can be formed in the device wafer 200 which extends downwardly from the rear surface 221 towards the front surface 222 of the device wafer 200. The first opening 230 can be formed for example, by directing a jet of fine abrasive particles towards the device wafer 200 at the location where it is desired to remove material (e.g., silicon) from the semiconductor element 220.

This sandblasting process can be used to form multiple first openings 230 in a single device wafer 200. The first openings 230 can be formed in one sandblasting operation simultaneously by directing the particles through appropriately-sized openings in a mask element such as a metal template or a sacrificial masking layer, for example. Alternatively, the first openings 230 can be formed sequentially by moving the nozzle of a sandblasting tool in a step-wise manner between locations above the wafer, pausing the flow of particles during movement between stations. Still another possibility is to use sandblasting to form some openings that are close together at the same time, and then move the sandblasting nozzle to a different location on the wafer and repeat the process again.

The fine abrasive particles can be, for example, aluminum oxide or silicon carbide. The fine abrasive particles can have an average size, for example, of at least 1 micrometer. The jet of fine abrasive particles can include a gas medium or a liquid medium. An exemplary gas medium can be, for example, compressed air or nitrogen.

In one embodiment, the first opening 230 can be formed by sandblasting, for example, after forming a sacrificial masking layer, e.g., a resist mask layer (not shown) on a device wafer 200 where it is desired to preserve remaining portions of the rear surfaces 221 of the microelectronic units 210. For example, photolithography can be used to pattern the resist mask layer to cover only portions of the rear surface 221, after which sandblasting can be conducted to form the first opening 230.

Each first opening 230 has a lower surface 232 that is flat and typically equidistant from the front surface 222. Inner surfaces 231 of the first opening 230, extending downwardly from the rear surface 221 towards the lower surface 232, may be sloped, i.e., may extend at angles other a normal angle (right angle) to the rear surface 221, as shown in FIG. 5A.

For example, when sandblasting is used to form the first opening 230, the wall angle of the inner surfaces 231 of the first opening 230 (i.e., the average angle 235 to a horizontal axis defined by the rear surface 221) can be, for example, between 60 and 100 degrees, wherein an angle of 90 degrees is normal to the rear surface, and may typically be approximately 75 degrees.

Alternatively, instead of being sloped, the inner surfaces of the first opening 230 may extend in a vertical or substantially vertical direction downwardly from the rear surface 221 substantially at right angles to the rear surface 221.

The inner surface 231 and the lower surface 232 of each first opening 230 can have a high surface roughness. For example, the surface roughness of the inner surface 231 and the lower surface 232 can have a surface roughness of greater than 1 micron. The surface roughness of the inner surface 231 and the lower surface 232 can be uniform or non-uniform across portions thereof. The inner surface 231 and the lower surface 232 can have stressed silicon across some or all portions thereof. In some embodiments, the inner surface 231 and the lower surface 232 can be etched in order to remove some or all of the areas of stressed silicon.

As shown in FIGS. 5A and 5B, the first opening 230 is located over four conductive pads 250 located on two microelectronic units 210, such that when the microelectronic units 210 are severed from each other along the dicing lane 212, half of the first opening 230 will be located on each microelectronic unit 210. As used herein in the specification and in the claims, the term "first opening" can refer to a first opening that is located entirely within a single microelectronic unit (e.g., as shown in FIGS. 12A and 12B), a first opening that extends across a plurality of microelectronic units 210 when it is formed (e.g., as shown in FIGS. 3A through 11B), or a portion of a first opening that is located on a particular microelectronic unit 210 after it is severed from other microelectronic units 210.

After forming the first openings 230 in the device wafer 200, a photoimageable layer such as a photoresist or a dielectric layer is deposited onto the rear surface 221 of the device wafer 200 and patterned to form mask openings 233 overlying the lower surface 232 and at least partially overlying the conductive pads 250. The mask openings 233 in the photoimageable layer or the dielectric layer are located at the desired locations for forming second openings 240 extending between the first opening 230 and bottom surfaces 251 of respective conductive pads 250. In embodiments where the second openings 240 are formed by sandblasting, the mask that is patterned to form mask openings 233 can be a sacrificial layer, for example, a resist mask layer.

Referring now to FIG. 6, the first opening 230 can be formed as a stripe or channel extending in a vertical direction 202 over the device wafer in alignment with the dicing lane 212. As best seen in FIG. 6, elongated first openings 230 desirably are formed simultaneously which extend in a vertical direction 202 of the device wafer in alignment with vertically extending dicing lanes 212. The vertically extending first openings 230 can be formed to extend only along dicing lines 212 of respective pairs of microelectronic units 210. In such a case, the first openings 230 may not overlie corner portions of the microelectronic units 210 at intersections between the vertical dicing lanes 212 and horizontal dicing lanes 214 extending in a horizontal direction 204 of the device wafer 200. In another example, horizontally extending first openings 230 can be formed to overlie the conductive pads 250 adjacent to the horizontal dicing lanes 214 of each microelectronic unit 210. Both vertically extending first openings 230 and horizontally extending first openings 230 can be formed in the device wafer 200.

In a particular example, first openings 230 may be formed which overlie the conductive pads 250 adjacent to only one of the dicing lanes 212 which bound a microelectronic unit 210. In another example, the first openings 230 can be formed which overlie only two dicing lanes 212 of the microelectronic unit 210 or which overlie only three dicing lanes 212 or more dicing lanes which bound a microelectronic unit 210. In one example, first openings 230 can be made smaller than as shown in FIG. 6, such that the first openings 230 overlie only some conductive pads 250 or rows of conductive pads 250 that lie adjacent to the dicing lanes 212 of the device wafer 200. In yet another example as illustrated in FIG. 7, first openings 230 aligned with dicing lanes 212 can extend as stripes between respective edges 206 and 208 of the device wafer 200.

Thereafter, as illustrated in FIGS. 8A and 8B, an etch process can be applied to the portions of the lower surface 232 exposed within the mask openings 233 so as to remove the semiconductor material underlying the mask openings 233. As a result, second openings 240 are formed that extend between the lower surface 232 in contact with the conductive pads 250.

Wet etching processes, e.g., isotropic etching processes and sawing using a tapered blade, among others, can be used to form second openings 240 having sloped inner surfaces 241. Laser dicing, mechanical milling, among others, can also be used to form second openings 240 having sloped inner surfaces 241. In some embodiments, anisotropic etching processes, laser dicing, laser drilling, mechanical removal processes, e.g., sawing, milling, ultrasonic machining, among others, can be used to form second openings having essentially vertical inner surfaces.

In embodiments where the second opening 240 is formed by a wet etching process, the etching angle can be, for example, approximately 55 degrees. Alternatively, the second openings 240 can be formed by sandblasting (e.g., as in the embodiments shown and described below with reference to FIGS. 16 through 22B).

The etch process can be conducted in a manner that selectively etches the semiconductor material, e.g., silicon, but preserves oxide material. Typically, the front contacts, e.g., conductive pads 250 of a semiconductor element overlie one or more layers of oxide material or other dielectric material which is used as a passivation layer to electrically isolate the semiconductor element. By etching the semiconductor material in a selective manner that preserves the dielectric, over-etching can be performed as needed to etch through the thickness of the semiconductor material in all locations of the device wafer 200 while maintaining a sufficient process window across the device wafer 200. When a selective etch process is used, the dielectric layer, e.g., oxide layer, remains in place after forming the second openings 240. Alternatively, laser drilling or mechanical milling can be used to form the second openings 240, in which case, the bottom surfaces 251 of the conductive pads 250 can be exposed within the second openings 240.

Thereafter, in the stage of fabrication illustrated in FIG. 9, a dielectric layer 225 is formed on inner surfaces 241 of the second openings 240, the inner surfaces 231 of the first openings 230, and the rear surfaces 221 of the semiconductor elements 220. Various methods can be used to form the dielectric layer 225. In one example, a flowable dielectric material is applied to the rear surface 221 of a device wafer 200 containing microelectronic units 210, and the flowable material is then more evenly distributed across the rear surface 221 of the device wafer 200 during a "spin-coating" operation, followed by a drying cycle which may include heating. In another example, a thermoplastic film of dielectric material can be applied to the rear surface 221 of the device wafer 200 after which the assembly is heated, causing the film to flow downward onto the inner surfaces 231 and the lower surfaces 232 of the first opening 230 and into the second openings 240. In another example, vapor deposition can be used to form the dielectric layer 225.

In still another example, the assembly including the device wafer 200 can be immersed in a dielectric deposition bath to form a conformal dielectric coating or dielectric layer 225. As used herein, a "conformal coating" is a coating of a particular material that conforms to a contour of the surface being coated, such as when the dielectric layer 225 conforms to a contour of the first opening 230 or the second opening 240 of the semiconductor element 220. An electrochemical deposition method can be used to form the conformal dielectric layer 225, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 225 on exposed surfaces of the device wafer which are conductive or semiconductive, including but not limited to along the rear surfaces 221, the inner surfaces 231 and lower surface 232 of the first opening 230, and the inner surfaces 241 of the second openings 240. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on the remaining dielectric layer overlying the bottom surfaces 251 of the conductive pads 250, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 225 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |
| ECOAT NAME | ELECTROLAC | LECTRASEAL DV494 | LECTROBASE 101 |
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |

TABLE 1-continued

| BATH CHARACTERISTICS | | | |
|---|---|---|---|
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Then, still referring to FIG. 9, conductive vias 260 are formed within the second openings 240. The conductive vias 260 are electrically connected to the bottom surfaces 251 of the conductive pads 250 and insulated from the semiconductor element 220 by the dielectric layer 225. If prior processing results in the dielectric layer 225 obstructing the bottom surfaces 251 of the conductive pads 250, laser drilling, mechanical milling, or other appropriate techniques can be used to open the bottoms of the second openings 240 adjacent to the conductive pads 250.

In addition, if any part of a preexisting dielectric layer (e.g., a passivation layer) of the semiconductor element 220 remains in alignment with the conductive pads 250, such layer can be removed in this step. Such removal can be accomplished, for example, laser drilling, mechanical milling, or another suitable technique. Other possible removal techniques include various selective etching techniques which can be isotropic or anisotropic in nature. Anisotropic etch processes include reactive ion etch processes in which a stream of ions are directed towards surfaces to be etched. Reactive ion etch processes are generally less selective than isotropic etch processes such that surfaces at which ions strike at high angles of incidence are etched to a greater extent than surfaces which are oriented with the stream of ions. When a reactive ion etch process is used, desirably, a mask layer is desirably deposited to overlie the conformal dielectric layer 225 and openings are formed therein which are aligned with the second openings 240. In such a way, the etch process avoids removing portions of the dielectric layer 225 other than that which lies within the second openings 240.

To form the conductive vias 260, an exemplary method involves depositing a metal layer by sputtering a primary metal layer onto exposed surfaces of the assembly, or by electroless deposition. This step can be performed by blanket deposition onto the rear surface 221, the inner surfaces 231 and the lower surfaces 232 of the first opening 230, the inner surfaces 241 of the second openings 240, and the bottom surface 251 of the conductive pads 250, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the conductive vias 260.

Figure 10A:
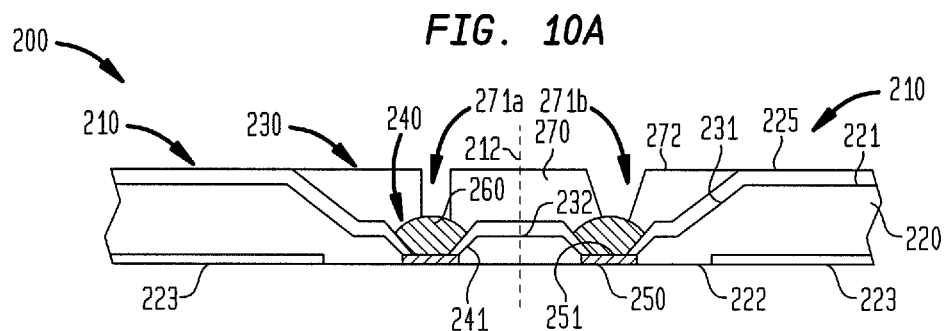
FIGS. 10A and 10B are a sectional view and a corresponding top-down plan view illustrating a stage of fabrication in accordance with an embodiment of the invention.
Figure 10B:
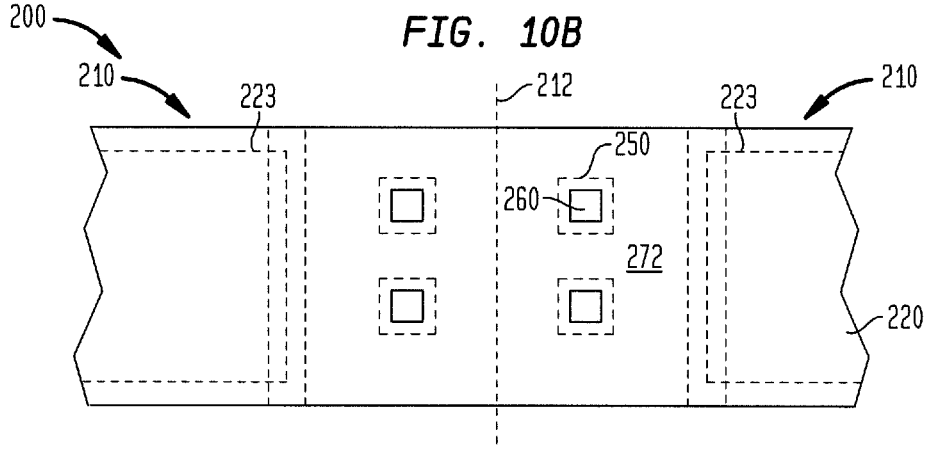

Referring to FIGS. 10A and 10B, a dielectric region 270 is formed inside the first opening 230. The dielectric region 270 can include an inorganic material, a polymeric material, or both. Optionally, the dielectric region 270 can be formed such that an exposed outer surface 272 of the region is co-planar or substantially co-planar with the rear surface 221 of the semiconductor element or the exposed surface of the dielectric layer 225. For example, a self-planarizing dielectric material can be deposited in the first opening 230, e.g., by a dispensing or stenciling process. In another example, a grinding, lapping, or polishing process can be applied to the rear surface 221 of the semiconductor element or the exposed surface of the dielectric layer 225 after forming the dielectric region 270 to planarize the surface of the dielectric region 270 to the rear surface 221 or the exposed surface of the dielectric layer 225.

In a particular embodiment, the dielectric region 270 can be compliant, having a sufficiently low modulus of elasticity and sufficient thickness such that the product of the modulus and the thickness provide compliancy. Specifically, in some embodiments (e.g., the embodiment shown and described with reference to FIG. 17) such a compliant dielectric can allow the conductive interconnect and the conductive contact attached thereto to flex or move somewhat relative to the semiconductor element when an external load is applied to the conductive contact.

Then, apertures 271a and 271b (or generally, 271) are formed, extending through the dielectric region 270 between respective conductive vias 260 and the outer surface 272 of the dielectric region 270. The apertures 271 can be formed, for example, via laser ablation, or any other appropriate method. As shown in FIG. 10A, the apertures 271 are a cylindrical shaped aperture 271a or a frusto-conical shaped aperture 271b. In other embodiments (not shown), the apertures 271 can have other shapes, including for example, a combination of a cylindrical and a frusto-conical shape at different distances from the rear surface 221.

Figure 11A:
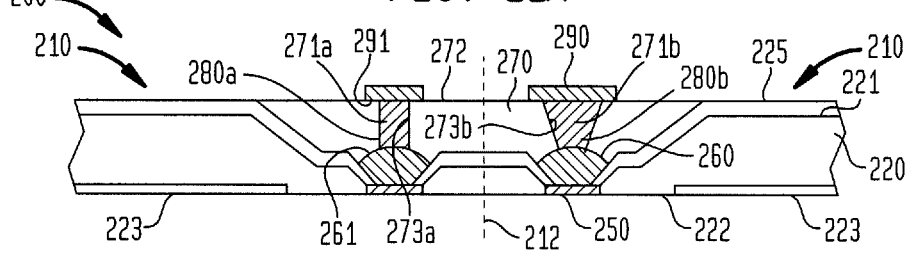
FIGS. 11A and 11B are a sectional view and a corresponding top-down plan view illustrating a stage of fabrication in accordance with an embodiment of the invention.
Figure 11B:
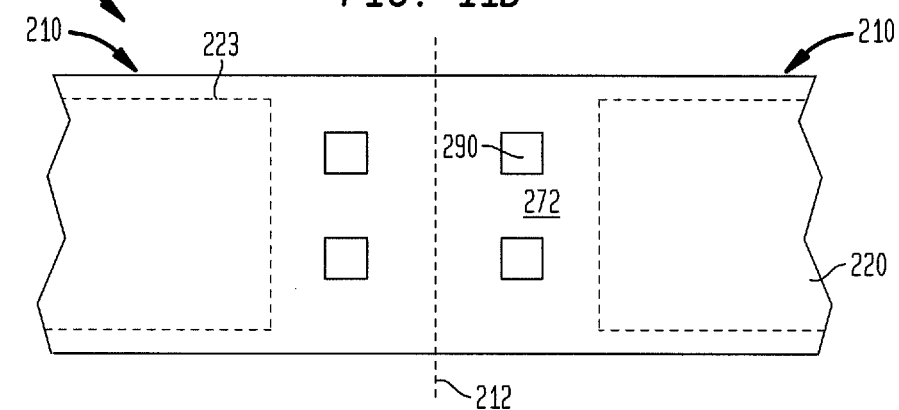

Referring now to FIGS. 11A and 11B, the conductive interconnects 280a and 280b (or generally, 280) are formed within the respective apertures 271a and 271b. The conductive interconnects 280 are electrically connected to upper surfaces 261 of respective conductive vias 260 and insulated from the semiconductor element 220 by the dielectric region 270 and the dielectric layer 225. To form the conductive interconnects 280, an exemplary method involves electroless deposition. This step can be performed by blanket deposition onto the inner surfaces 273a and 273b of the respective apertures 271a and 271b, for example, such that the shape of each conductive interconnect 280a (conical) and 280b (frusto-conical) conforms to a contour of the respective inner surface 273a and 273b. As shown in FIG. 11A, the conductive interconnects 280a and 280b are solid. In other embodiments (not shown), each conductive interconnect 280 can include an internal space that is filled with a dielectric material.

Then, the conductive contacts 290 are formed. The conductive contacts 290 are exposed at an outer surface 272 of the dielectric region 270 for interconnection to an external element. The conductive contacts 290 are electrically connected to respective conductive interconnects 280 at the bottom surfaces 291 thereof. In some embodiments, the conductive interconnects 280 and the conductive contacts 290 can be formed during a single electroless deposition step. In other embodiments, the conductive interconnects 280 and the conductive contacts 290 can be formed by separate electroless deposition steps.

In one embodiment, the primary metal layer that comprises the conductive interconnects 280 and/or the conductive contacts 290 includes or consists essentially of aluminum. In another particular embodiment, the primary metal layer includes or consists essentially of copper. In yet another embodiment, the primary metal layer includes titanium. One or more other exemplary metals can be used in a process to form the conductive interconnects 280 and/or the conductive contacts 290.

Finally, the microelectronic units 210 are severed from each other along dicing lane 212 by sawing or other dicing method to form individual microelectronic units 210 as illustrated in FIGS. 11A-11B. A variety of exemplary processes for severing device wafers into individual units are described in the herein incorporated commonly owned U.S. Provisional Application Nos. 60/761,171 and 60/775,086, any of which can be used to sever the device wafers to form individual microelectronic units 210 as shown in FIGS. 11A-11B.

FIGS. 12A and 12B illustrate a microelectronic unit in accordance with another embodiment of the invention. The microelectronic unit 310 is similar to the microelectronic unit 110 described above and shown in FIG. 2, but the microelectronic unit 310 differs in the location of the first openings 330 and the second openings 340 within the microelectronic unit. Similar to the embodiments shown and described above, the first openings 330 can be formed by sandblasting.

Rather than having a first opening located in the center of the microelectronic unit and active semiconductor regions of the semiconductor element located towards the periphery of the microelectronic unit, the microelectronic unit 310 includes a plurality of first openings 330, each located towards a periphery of the microelectronic unit 310, and the active semiconductor regions 323 are located towards the center of the microelectronic unit 310.

In this embodiment, each first opening 330 is in the form of a channel extending over a row of individual second openings 340, with each second opening 340 extending toward the bottom surface 351 of a conductive pad 350. In other embodiments (not shown), each first opening 330 can extend to a single respective second openings 340 that extends to a single conductive pad 350.

As shown in FIG. 12B, each first opening 330 extends across most of the length of the microelectronic unit 310. In other embodiments, a single first opening 330 can extend across the length of a wafer, traversing a plurality of microelectronic units 310, such as in the embodiment shown in FIG. 7. The thickness of the microelectronic units 310 while it is in wafer form can be reduced from its original thickness prior to performing steps to form the microelectronic units 310 shown in FIGS. 12A and 12B.

Figure 13:
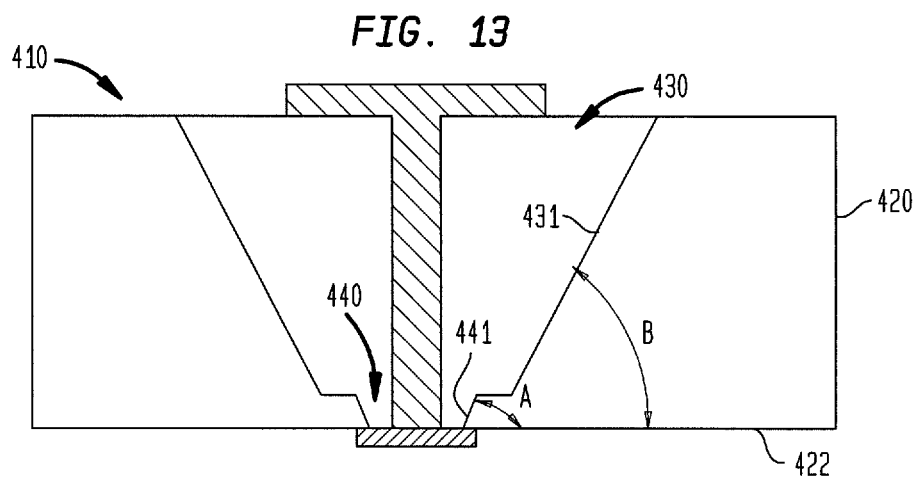
FIG. 13 is a sectional view illustrating a via structure in accordance with an embodiment of the invention.

FIG. 13 illustrates a microelectronic unit in accordance with another embodiment of the invention. The microelectronic unit 410 is similar to the microelectronic unit 110 described above and shown in FIG. 2, but the microelectronic unit 410 illustrates how the angle B made by the inner surface 431 of the first opening 430 relative to the front surface 422 of the semiconductor element 420 can be different than the angle A made by the inner surface 441 of the second opening 440 relative to the front surface 422.

The inner surface 431 of the first opening 430 can have a constant slope or a varying slope. For example, the angle B or slope of the inner surface 431 relative to the horizontal plane defined by the front surface 422 can decrease as the inner surface 431 penetrates further towards the front surface 422.

The inner surface 441 of the second opening 440 can also have a constant slope or a varying slope. For example, the angle A or slope of the inner surface 441 relative to the horizontal plane defined by the front surface 422 can decrease in magnitude as the inner surface 441 penetrates further towards the front surface 422.

For example, in embodiments where the first opening 430 is formed by sandblasting, the wall angle of the inner surfaces 431 of the first opening 430 can be, for example, between 60 and 100 degrees, and may typically be approximately 75 degrees. In embodiments where the second opening 440 is formed by a wet etching process, the etching angle can be, for example, approximately 55 degrees.

Figure 14:
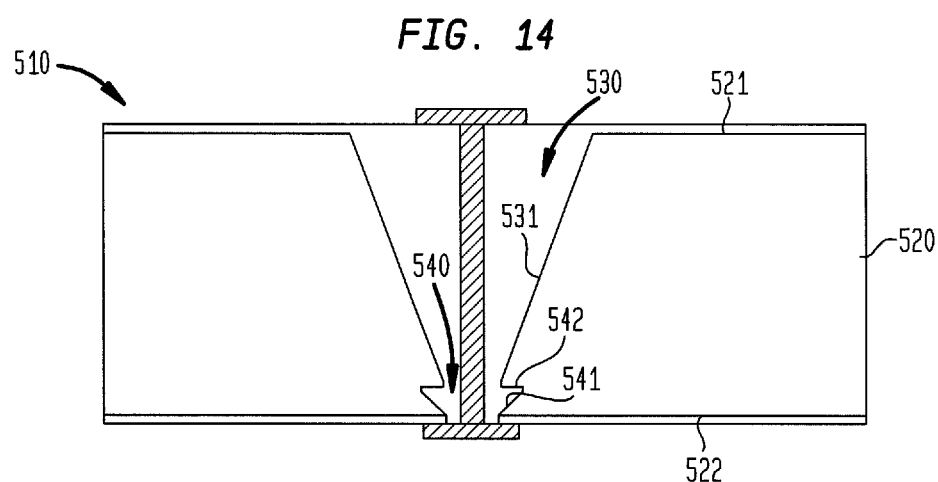
FIG. 14 is a sectional view illustrating a via structure in accordance with an embodiment of the invention.

FIG. 14 illustrates a microelectronic unit in accordance with another embodiment. The microelectronic unit 510 is similar to the microelectronic unit 110 described above with reference to FIG. 2, but the microelectronic unit 510 differs in the structure of the semiconductor element 520 at the interface between the first opening 530 and the second opening 540.

Rather than having a lower surface 132 of the first opening 130 that is flat and typically equidistant from the front surface 122 as shown in FIG. 2, the semiconductor element 520 does not have such a lower surface of the first opening 530. Instead, the first opening 530 has an inner surface 531 having a lower diameter that is less than an upper diameter of an inner surface 541 of the second opening 540, such that the inner surface 541 meets an upper surface 542 of the second opening 540 that is flat and equidistant from the front surface 522.

The upper surface 542 of the second opening 540 can be considered to have a "negative angle" with respect to the rear surface 521. As used herein, the term "negative angle" as applied to a first surface with respect to a second surface means that the second surface "shields" or "shades" the first surface from exposure to a beam of particles, radiation, or the substantial flow of a gas traveling in a direction from the second surface past the location of the first surface. For example, the upper surface 542 extends underneath a portion of the inner surface 541 such that the inner surface 541 shields or shades the upper surface 542 from a beam or a gas flowing in a direction from the first opening 530 into the second opening 540. The second opening 540, in such case, can be referred to as having "reentrant" shape with respect to the first opening 530. Despite this arrangement, electrochemical deposition can be used to adequately form an insulating coating on surfaces of the reentrant shape second opening 540, because the coating is formed by wet processing, rather than by exposure to a beam or a gas, these other processes being less well adapted thereto.

Figure 15:
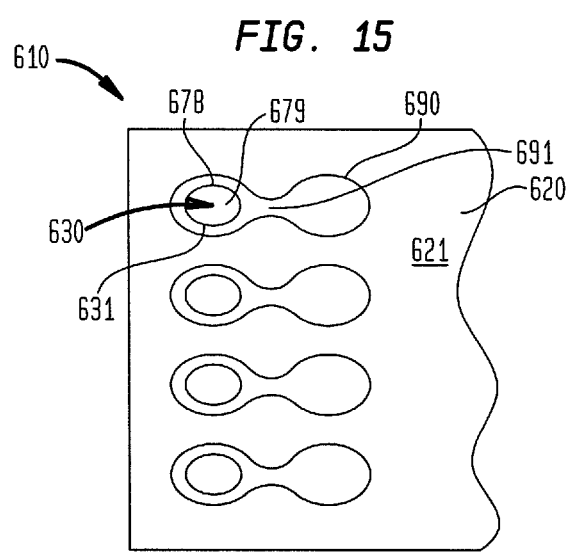
FIG. 15 is a top-down plan view illustrating a via structure in accordance with an embodiment of the invention.

FIG. 15 illustrates a microelectronic unit in accordance with another embodiment. The microelectronic unit 610 is similar to the microelectronic unit 10 described above with reference to FIG. 1A, but the microelectronic unit 610 differs in the configuration of the conductive interconnection between the front and rear surfaces of the semiconductor element 620.

In one example, rather than having a conical or frustoconical conductive interconnect that extends within the first opening inside an aperture formed in a dielectric region, a conductive via 678 extends within the first opening 630 and is conformal to an inner surface 631 of the first opening 630. The conductive via 678 can be connected to a conductive pad located at the front surface of the semiconductor element 620 by a conductive element (e.g., a conductive via or a conductive interconnect) that extends through a second opening located between the first opening and the front surface of the semiconductor element 620.

To form the conductive via 678, the first opening 630 can be coated with a dielectric layer, and a conductive metal can be deposited onto the dielectric layer to create the conductive via 678. An interior space 679 can be filled with a dielectric region, or the interior space 679 can remain open and filled with air.

In this example embodiment, the conductive via 678 is connected to a conductive contact 690 by a conductive trace 691 that extends therebetween along the rear surface 621 of the semiconductor element 620.

FIGS. 16 through 22B illustrate various interposer via structures in accordance with embodiments of the invention. FIG. 16 illustrates an interconnection substrate in accordance with another embodiment. The interconnection substrate 810 is similar to the microelectronic unit 10 described above with reference to FIG. 1, but the interconnection substrate 810 differs in that the interconnection substrate 810 need not contain an active semiconductor region.

Because there is no active semiconductor region in the interconnection substrate 810, the second opening 840 can be created by sandblasting, etching, or another process from the front surface 822 without risking damage to the chip. Also, rather than having the conductive pads provided on the front surface 822, the conductive pads 850 can be formed after forming the second opening 840. If, for example, the second opening 840 is formed from the front surface 822, sandblasting can be used to remove a portion of an inorganic dielectric layer that may be present on the front surface 822 of the semiconductor element 820. The use of sandblasting to remove a portion of an inorganic dielectric layer from a microelectronic unit is also contemplated in any or all of the other embodiments described herein.

To fabricate the interconnection substrate 810, in one example, the second opening 840 can be created first and then coated with a dielectric layer 825 and filled with a conductive via 860. The first opening 830 can then be created by sandblasting and filled with a dielectric region 870. An aperture 871 can be created through the dielectric region 870 and then filled with a conductive interconnect 880. Finally, a conductive pad 850 can be attached to the conductive via 860, and a conductive contact 890 can be attached to the conductive interconnect 880. Alternatively, the first opening 830 can be created first, after which the second opening 840 can be created. Forming of the conductive via 860 can be done either before or after the conductive interconnect 880 is formed.

FIG. 17 illustrates an interconnection substrate in accordance with another embodiment. The interconnection substrate 910 is similar to the interconnection substrate 810 described above with reference to FIG. 16, but the interconnection substrate 910 differs in the structure of the dielectric region and in the configuration of the electrical connection between the conductive pad and the conductive contact.

Rather than having a separate conductive interconnect and conductive via, the interconnection substrate 910 includes a single unitary conductive interconnect 978 extending between the conductive pad 950 and the conductive contact 990. The conductive interconnect 978 includes a conductive interconnect portion 980 extending from the conductive pad 950 through the first opening 930 and a conductive via portion 960 extending from the conductive contact 990 through the second opening 940.

Rather than having a dielectric layer coating the inner surface 941 of the second opening 940 and a separate dielectric region filling the space between the inner surface 931 of the first opening 930 and the conductive interconnect 978, the interconnection substrate 910 includes a single unitary dielectric region 970 coating the inner surface 931 of the first opening 930, the inner surface 941 of the second opening 940, and the rear surface 921 of the semiconductor element 120. The dielectric region 970 also fills the space between the inner surfaces 931 and 941 and the conductive interconnect 978.

To form the single conductive interconnect 978, the dielectric region 970 can be applied inside the first opening 930 and the second opening 940. An aperture 971 can be created extending completely through the dielectric region 970, for example via laser ablation. The aperture 971 can be metalized, e.g., plated with a metal, a conductive compound of a metal, or both, or be metalized by a process other than plating, such as by sputtering, application of a fusible metal, e.g., solder, or otherwise. In an example, the metal can be copper, gold, or both. The conductive interconnect 978 can be solid or can be in the form of a conductive coating lining an inner surface of the aperture 971. The conductive coating can define an internal space, which in one example can be empty, can be covered with a dielectric material, or can be filled with a dielectric material.

The dielectric region 970 can be compliant, having a sufficiently low modulus of elasticity and sufficient thickness such that the product of the modulus and the thickness provide compliancy. Specifically, the dielectric region 970 can allow the conductive interconnect 978 and the conductive contact 990 and the conductive pad 950 attached thereto to flex or move somewhat relative to the semiconductor element 920 when an external load is applied to the conductive contact 990 or the conductive pad 950. In that way, the bond between the conductive contacts 990 or the conductive pads 950 of the interconnection substrate 910 and terminals of a circuit panel (not shown) can better withstand thermal strain due to mismatch of the coefficient of thermal expansion ("CTE") between the interconnection substrate 910 and the circuit panel.

In one embodiment, the degree of compliancy provided by the product of the thickness of the dielectric region 970 and its modulus of elasticity can be sufficient to compensate for strain applied to the conductive contacts 990 or the conductive pads 950 due to thermal expansion mismatch between the interconnection substrate 910 and a substrate to which the microelectronic unit is mounted through the conductive contacts 990 or the conductive pads 950. An underfill (not shown) can be provided between the exposed surface of the dielectric region 970 and such circuit panel to enhance resistance to thermal strain due to CTE mismatch.

FIG. 18 illustrates an interconnection substrate in accordance with another embodiment. The interconnection substrate 1010 is similar to the interconnection substrate 810 described above with reference to FIG. 16, but the interconnection substrate 1010 differs in the configuration of the conductive via 1060.

In one example, rather than having a conductive via that fully fills the space inside of the second opening 1040 that is not occupied by the dielectric layer 1025, the conductive via 1060 can be deposited as a metallic layer onto the dielectric layer 1025, such that an internal space 1027 is created inside the conductive via 1060.

To fabricate the interconnection substrate 1010, for example, the second opening 1040 can be created first, e.g., by sandblasting, and then coated with a dielectric layer 1025 and a conductive metal can be deposited onto the dielectric layer 1025 to create a conductive via 1060. The first opening 1030 can then be created, e.g., by sandblasting, such that an upper surface 1061 of the conductive via 1060 is exposed. The first opening 1030 can then be filled with a dielectric region 1070. An aperture 1071 can be created through the dielectric region 1070 and then filled with a conductive interconnect 1080. Finally, a conductive pad 1092 can be coupled to the conductive via 1060, for example, through a conductive trace 1094 extending along the front surface 1022. The conductive pad 1092 can be exposed at the front surface 1022 for interconnection to another component. In another embodiment, the pad can be omitted, and a bonding material can be disposed in the conductive via 1060 for connecting the interconnection substrate 1010 to another component. In one embodiment, a conductive contact can be attached to the conductive interconnect 1080.

Figure 19A:
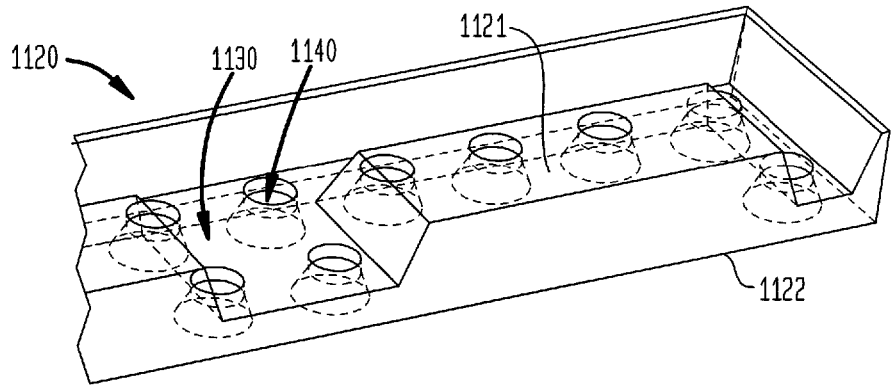
FIG. 19A is a perspective view illustrating a via structure including a channel-shaped opening coupled to a plurality of smaller openings in accordance with another embodiment.

FIG. 19A is a perspective view illustrating an interconnection substrate including a channel-shaped first opening that meets a plurality of smaller second openings in accordance with another embodiment. The semiconductor element 1120 is similar to the semiconductor elements 820, 920, and 1020 shown and described with respect to FIGS. 16-18, but the semiconductor element 1120 has channel-shaped first openings 1130, each first opening 1130 being coupled to a plurality of second openings 1140. Similar to the embodiments shown and described above, the first openings 1130 and the second openings 1140 can be formed, for example, by sandblasting. Alternatively, the second openings 1140 can be formed by etching, laser ablation, mechanical milling, or other methods.

Figure 19B:
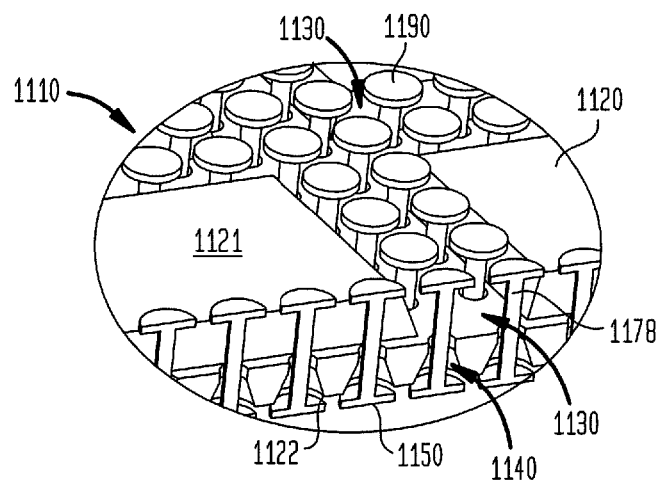
FIG. 19B is a perspective view illustrating the via structure depicted in FIG. 19A further including conductive bond pads and metallic interconnection elements.
Figure 19C:
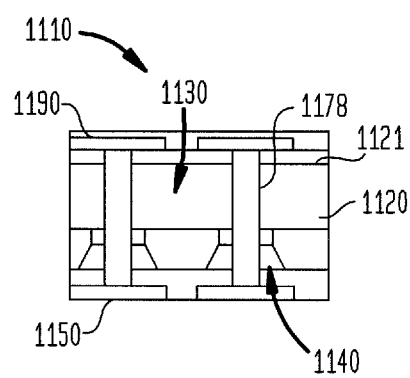
FIG. 19C is a partial sectional view illustrating a portion of the via structure depicted in FIG. 19B, the section taken through line 19C-19C of FIG. 19B.

FIGS. 19B and 19C illustrate the semiconductor element 1120 depicted in FIG. 19A further including conductive bond pads and metallic interconnection elements. The interconnection substrate 1110 shown in FIGS. 19B and 19C includes the semiconductor element 1120 shown in FIG. 19A that has channel-shaped first openings 1130, each first opening 1130 coupled to a plurality of second openings 1140. The interconnection substrate 1110 further includes a plurality of conductive interconnects 1178, each conductive interconnect 1178 coupled to a conductive pad 1150 at the front surface 1122 of the semiconductor element 1120 and a conductive contact 1190 at the rear surface 1121 of the semiconductor element 1120.

It can be seen in FIGS. 19B and 19C that the structure and arrangement of each first opening 1130, second opening 1140, conductive interconnect 1178, conductive pad 1150, and conductive contact 1190 is similar to the structure and arrangement shown and described above with reference to FIG. 17.

Figure 20:
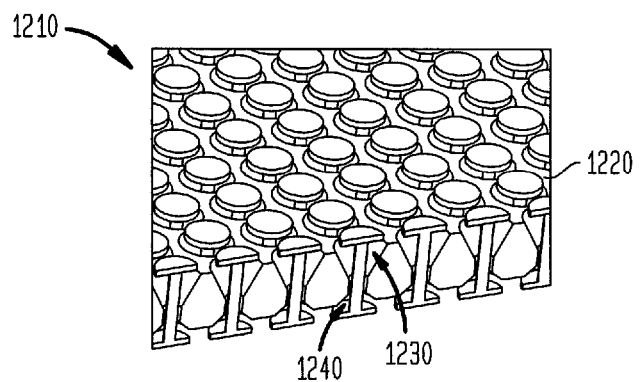
FIG. 20 is a perspective view illustrating a portion of an interposer in accordance with another embodiment.

FIG. 20 is a perspective view illustrating a portion of an interposer in accordance with an embodiment. The interconnection substrate 1210 is similar to the interconnection substrate shown and described with respect to FIGS. 19B and 19C, but the semiconductor element 1220 has round first openings 1230, each first opening 1230 meeting a single second opening 1240.

Figure 21A:
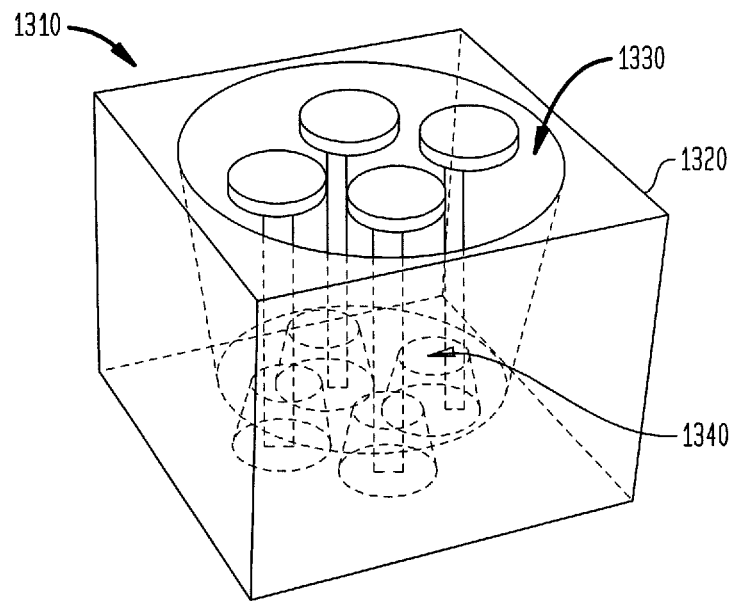
FIGS. 21A and 21B are a perspective view and a perspective sectional view illustrating a via structure including a single large opening and a plurality of smaller openings in accordance with another embodiment.
Figure 21B:
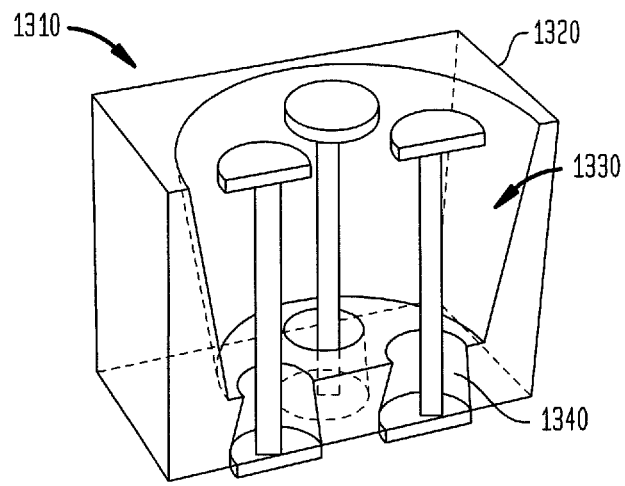

FIGS. 21A and 21B are a perspective view and a perspective sectional view illustrating an interconnection substrate structure including a single large opening and a plurality of smaller openings in accordance with another embodiment. The interconnection substrate 1310 is similar to the interconnection substrate shown and described with respect to FIGS. 19B and 19C, but the semiconductor element 1320 has round first openings 1330, each first opening 1330 meeting four second openings 1340, arranged in a cluster-like configuration.

Figure 22A:
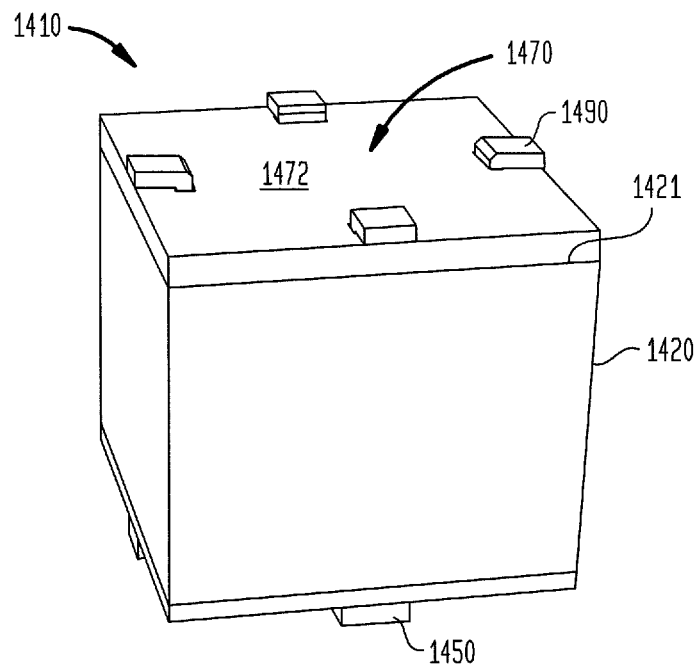
FIGS. 22A and 22B are a perspective view and a perspective sectional view illustrating a via structure including a single large opening and a plurality of smaller openings in accordance with another embodiment.
Figure 22B:
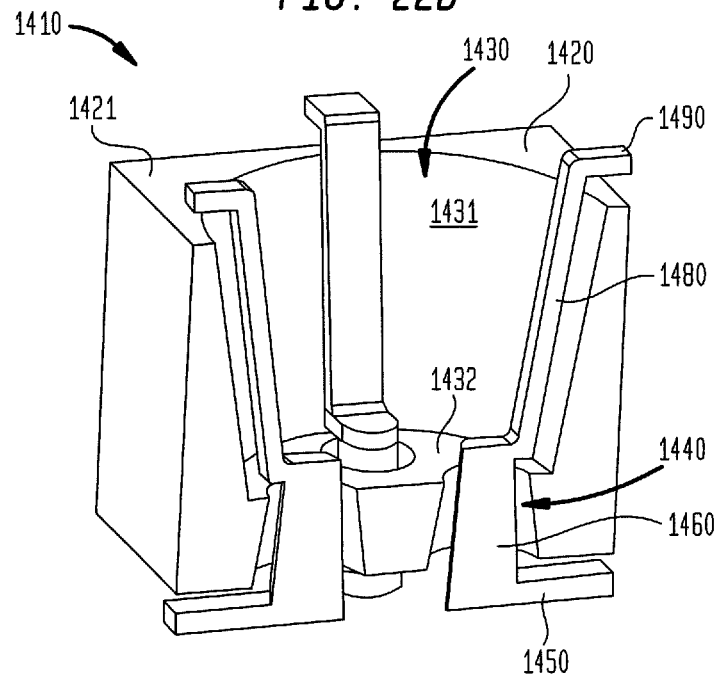

FIGS. 22A and 22B are a perspective view and a perspective sectional view illustrating an interconnection substrate structure including a single large opening and a plurality of smaller openings in accordance with another embodiment. The interconnection substrate 1410 is similar to the interconnection substrate 1310 shown and described with respect to FIGS. 21A and 21B, but rather than having unitary conductive interconnects extending from the front to the rear surface, each second opening 1440 includes a frusto-conical conductive via 1460 extending from a respective conductive pad 1450 through the second opening 1440, and the first opening 1430 includes a plurality of conductive interconnects 1480 that extend as traces along an inner surface 1431 of the first opening 1430.

Each conductive interconnect 1480 can extend from a respective conductive via 1460 to a respective conductive contact 1490 at the rear surface 1421 of the semiconductor element 1420 and is insulated from each of the other conductive interconnects 1480 and conductive vias 1460 by dielectric material. Alternatively, in a variation of that shown in FIG. 22B, the conductive interconnects 1480 can be electrically connected together, for example, by metal (not shown) extending along a lower surface 1432 of the first opening 1430 between the conductive interconnects 1480.

In this embodiment, each conductive interconnect 1480 is conformal to a contour of the inner surface 1431 and the lower surface 1432 of the first opening 1430, although each conductive interconnect 1480 is separated from the inner surface 1431 and the lower surface 1432 by a conformal coating of a dielectric material (not shown in FIG. 22B and hidden in FIG. 22A). An electrochemical deposition method can be used to form the conformal dielectric layer, including for example, electrophoretic deposition or electrolytic deposition. As shown in FIG. 22A, a dielectric region 1470 can fill the remainder of the first opening 1430 not occupied by the conductive interconnects 1480 or the aforementioned dielectric layer, such that an outer surface 1472 extends above but is parallel to a plane defined by the rear surface 1421 of the semiconductor element 1420.

Similar to the embodiments shown and described above with respect to FIGS. 19A-19C, the first openings 1230, 1330, and 1430 and the second openings 1240, 1340, and 1440 shown in FIGS. 20 through 22B can be formed by sandblasting. Alternatively, the second openings 1240, 1340, and 1440 can be formed by etching, laser ablation, mechanical milling, or other methods.

The methods disclosed herein for forming via structures in semiconductor elements can be applied to a microelectronic substrate, such as a single semiconductor chip, or can be applied simultaneously to a plurality of individual semiconductor chips which can be held at defined spacings in a fixture or on a carrier for simultaneous processing. Alternatively, the methods disclosed herein can be applied to a microelectronic substrate or element including a plurality of semiconductor chips which are attached together in form of a wafer or portion of a wafer to perform processing as described above simultaneously with respect to a plurality of semiconductor chips on a wafer-level, panel-level or strip-level scale.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 23:
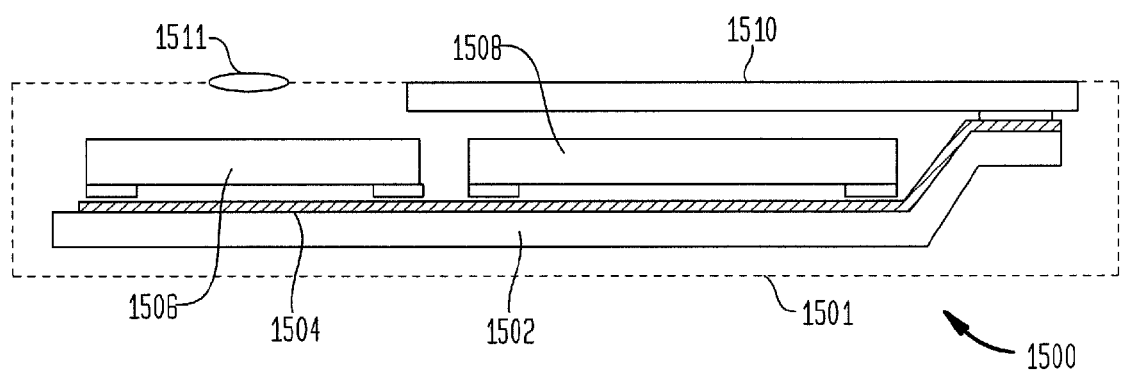
FIG. 23 is a schematic depiction of a system according to one embodiment of the invention.

The structures discussed above can be utilized in construction of diverse electronic systems. For example, a system 1500 in accordance with a further embodiment of the invention includes a structure 1506 as described above in conjunction with other electronic components 1508 and 1510. In the example depicted, component 1508 is a semiconductor chip whereas component 1510 is a display screen, but any other components can be used. Of course, although only two additional components are depicted in FIG. 23 for clarity of illustration, the system may include any number of such components. The structure 1506 as described above may be, for example, a microelectronic unit as discussed above in connection with FIG. 1A, or a structure incorporating plural microelectronic units. In a further variant, both may be provided, and any number of such structures may be used.

Structure 1506 and components 1508 and 1510 are mounted in a common housing 1501, schematically depicted in broken lines, and are electrically interconnected with one another as necessary to form the desired circuit. In the exemplary system shown, the system includes a circuit panel 1502 such as a flexible printed circuit board, and the circuit panel includes numerous conductors 1504, of which only one is depicted in FIG. 23, interconnecting the components with one another. However, this is merely exemplary; any suitable structure for making electrical connections can be used.

The housing 1501 is depicted as a portable housing of the type usable, for example, in a cellular telephone or personal digital assistant, and screen 1510 is exposed at the surface of the housing. Where structure 1506 includes a light-sensitive element such as an imaging chip, a lens 1511 or other optical device also may be provided for routing light to the structure. Again, the simplified system shown in FIG. 23 is merely exemplary; other systems, including systems commonly regarded as fixed structures, such as desktop computers, routers and the like can be made using the structures discussed above.

The vias and via conductors disclosed herein can be formed by processes such as those disclosed in greater detail in the co-pending, commonly assigned U.S. patent application Ser. Nos. 12/842,587, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of fabricating a microelectronic unit, comprising:

providing a semiconductor element having a front surface facing in a first direction and a rear surface remote from the front surface, a plurality of active semiconductor devices therein, and a plurality of conductive pads exposed at the front surface, the conductive pads having top surfaces exposed at the front surface of the semiconductor element and bottom surfaces opposite the top surfaces;

forming at least one first opening extending from the rear surface partially through the semiconductor element towards the front surface;

forming at least one second opening extending from the at least one first opening to the bottom surface of at least one of the conductive pads, the at least one second opening exposing at least a portion of the bottom surface of the at least one conductive pad;

forming at least one conductive via extending within the at least one second opening and coupled to the bottom surface of a respective one of the conductive pads;

forming a dielectric region filling the at least one first opening, the dielectric region having a top surface facing in a second direction opposite from the first direction, and forming an aperture penetrating through the dielectric region; and forming at least one conductive contact and at least one conductive interconnect coupled thereto, wherein the step of forming the at least one conductive interconnect includes depositing an electrically conductive material in contact with the bottom surface of the at least one conductive pad, each conductive interconnect extending within one or more of the first openings at least within the aperture and coupled to the at least one conductive pad, the at least one conductive contact exposed at the rear surface of the semiconductor element for electrical connection to an external device, and wherein the step of forming the at least one conductive contact includes depositing an electrically conductive material such that a bottom surface of the conductive contact facing in the first direction is formed in direct contact with the top surface of the dielectric region, the at least one conductive contact located completely within a boundary defined by edges of the first opening in a lateral direction along the rear surface, the bottom surface of the conductive contact located at or above a plane defined by the rear surface of the semiconductor element, wherein the step of forming the at least one conductive interconnect is performed after forming the conductive via, such that the conductive interconnect is coupled to the respective one of the conductive pads through the at least one conductive via, and wherein the step of forming the at least one second opening includes, from within the second opening, removing at least a portion of a passivation layer contacting the bottom surface of the respective one of the conductive pads.

2. A method as claimed in claim 1, wherein at least one of the plurality of conductive pads are electrically connected to at least one of the plurality of active semiconductor devices.

3. A method as claimed in claim 1, wherein the at least one conductive contact overlies the rear surface of the semiconductor element.

4. A method as claimed in claim 1, wherein the first opening has a first width in a lateral direction along the rear surface, and at least one of the conductive contacts has a second width in the lateral direction, the first width being greater than the second width.

5. A method as claimed in claim 1, wherein the step of forming the first opening includes forming a channel shape.

6. A method as claimed in claim 1, further comprising, after forming the first opening, reducing the surface roughness of an inner surface of the first opening.

7. A method as claimed in claim 6, wherein the step of reducing the surface roughness of the inner surface of the first opening includes using wet etching or plasma etching.

8. A method as claimed in claim 1, wherein the conductive interconnect has a cylindrical or frusto-conical shape.

9. A method as claimed in claim 1, wherein the conductive interconnect includes an internal space, further comprising the step of filling the internal space with a dielectric material.

10. A method as claimed in claim 1, wherein the step of forming the at least one second opening includes forming at least two second openings extending from one of the first openings and at least partially exposing the bottom surfaces of respective ones of the conductive pads.

11. A method as claimed in claim 1, wherein the step of forming the at least one conductive interconnect forms two or more conductive interconnects at least within the first opening extending to two or more respective ones of the at least one conductive vias.

12. A method as claimed in claim 1, wherein the step of forming the conductive interconnect includes plating an inner surface of the aperture.

13. A method as claimed in claim 1, wherein the dielectric region is deposited by electrochemical polymer deposition.

14. A method as claimed in claim 13, wherein the step of forming the dielectric region includes coating a surface having a negative angle with respect to the rear surface.

15. A method as claimed in claim 1, wherein the step of forming the dielectric region includes coating a surface having a negative angle with respect to the rear surface.

16. A method as claimed in claim 1, wherein the aperture has a contour not conforming to a contour of the at least one of the first or second openings.

17. A method as claimed in claim 16, wherein the aperture has a contour not conforming to a contour of the first opening.

18. A method as claimed in claim 16, wherein the aperture has a contour not conforming to a contour of the second opening.

19. A method as claimed in claim 1, wherein each conductive contact has a width in the lateral direction that is greater than a width of at least a portion of the conductive interconnect that is adjacent the conductive contact.

20. A method as claimed in claim 1, wherein the at least one first opening is formed by directing a jet of abrasive particles towards the semiconductor element.

21. A method as claimed in claim 20, wherein an average size of the abrasive particles is at least 1 micrometer.

22. A method as claimed in claim 20, wherein the jet of abrasive particles includes a gas medium.

23. A method as claimed in claim 20, wherein the jet of abrasive particles includes a liquid medium.

24. A method of fabricating an interconnection substrate, comprising:
providing a semiconductor element having a front surface facing in a first direction and a rear surface remote from the front surface, and at least one conductive element having a top surface exposed at the front surface;
forming at least one first opening extending from the rear surface partially through the semiconductor element towards the front surface;
forming at least one second opening extending from the at least one first opening and exposing at least a portion of the at least one conductive element, the second opening not extending through the at least one conductive element;
forming a dielectric region filling the at least one first opening, the dielectric region having a top surface facing in a second direction opposite from the first direction, and forming an aperture penetrating through the dielectric region; and
forming at least one conductive contact and at least one conductive interconnect coupled thereto, wherein the step of forming the at least one conductive interconnect includes depositing an electrically conductive material in contact with the at least one conductive element, each conductive interconnect extending within one or more of the first openings at least within the aperture and coupled directly or indirectly to at least one conductive element, the at least one conductive contact exposed at the rear surface of the semiconductor element for electrical connection to an external device, and wherein the step of forming the at least one conductive contact includes depositing an electrically conductive material such that a bottom surface of the conductive contact facing in the first direction is formed in direct contact with the top surface of the dielectric region, the at least one conductive contact located completely within a boundary defined by edges of the first opening in a lateral direction along the rear surface, the bottom surface of the conductive contact located at or above a plane defined by the rear surface of the semiconductor element,
wherein the semiconductor element further includes a passivation layer coating the front surface thereof, wherein the step of forming the at least one second opening includes the step of removing a portion of the passivation layer by directing a jet of fine abrasive particles towards the semiconductor element.

25. A method as claimed in claim 24, wherein the at least one conductive contact overlies the rear surface of the semiconductor element.

26. A method as claimed in claim 24, wherein the first opening has a first width in a lateral direction along the rear surface, and at least one of the conductive contacts has a second width in the lateral direction, the first width being greater than the second width.

27. A method as claimed in claim 24, wherein the step of forming the first opening includes forming a channel shape.

28. A method as claimed in claim 24, further comprising, after forming the first opening, reducing the surface roughness of an inner surface of the first opening.

29. A method as claimed in claim 28, wherein the step of reducing the surface roughness of the inner surface of the first opening includes using wet etching or plasma etching.

30. A method as claimed in claim 24, wherein the conductive interconnect has a cylindrical or frusto-conical shape.

31. A method as claimed in claim 24, wherein the conductive interconnect includes an internal space, further comprising the step of forming a dielectric material within the internal space.

32. A method as claimed in claim 24, wherein the conductive elements have bottom surfaces remote from the top surfaces, further comprising the step of forming at least one conductive via extending within the at least one second opening and coupled directly or indirectly to the bottom surface of a respective one of the conductive elements,
wherein the step of forming the at least one conductive interconnect is performed after forming the conductive via, such that the conductive interconnect is coupled to the conductive element through the at least one conductive via.

33. A method as claimed in claim 32, wherein the step of forming the at least one second opening includes forming at least two second openings extending from one of the first openings towards the front surface of the semiconductor element.

34. A method as claimed in claim 32, wherein the step of forming the at least one conductive interconnect forms two or more conductive interconnects at least within the first opening extending to two or more respective ones of the at least one conductive vias.

35. A method as claimed in claim 32, further comprising the step of forming a dielectric layer coating the second opening.

36. A method as claimed in claim 32, wherein one or more of the conductive elements includes an electrically conductive trace and the step of forming the at least one conductive via includes depositing the electrically conductive material in contact with the at least one conductive trace, the conductive element including an electrically conductive pad coupled to the conductive trace, the conductive trace extending along the front surface of the semiconductor element.

37. A method as claimed in claim 24, wherein the step of forming the conductive interconnect includes plating an inner surface of the aperture.

38. A method as claimed in claim 24, wherein the conductive elements include electrically conductive pads having top surfaces exposed at the front surface of the semiconductor element and bottom surfaces remote therefrom,
wherein the step of forming the at least one second opening at least partially exposes the bottom surface of at least one of the conductive pads and the step of forming the at least one conductive via includes depositing the conductive material in contact with the bottom surface of the at least one conductive pad.

39. A method as claimed in claim 38, wherein the step of forming at the least one second opening includes forming at least two second openings extending from one of the first openings towards the front surface of the semiconductor element.

40. A method as claimed in claim 24, wherein the aperture has a contour not conforming to a contour of the at least one of the first or second openings.

41. A method as claimed in claim 40, wherein the aperture has a contour not conforming to a contour of the first opening.

42. A method as claimed in claim 40, wherein the aperture has a contour not conforming to a contour of the second opening.

43. A method as claimed in claim 24, wherein each conductive contact has a width in the lateral direction that is greater than a width of at least a portion of the conductive interconnect that is adjacent the conductive contact.

44. A method as claimed in claim 24, wherein the at least one first opening is formed by directing a jet of abrasive particles towards the semiconductor element.

45. A method as claimed in claim 44, wherein an average size of the abrasive particles is at least 1 micrometer.

46. A method as claimed in claim 44, wherein the jet of abrasive particles includes a gas medium.

47. A method as claimed in claim 44, wherein the jet of abrasive particles includes a liquid medium.

48. A method of fabricating an interconnection substrate, comprising:
providing a semiconductor element having a front surface facing in a first direction and a rear surface remote from the front surface, and at least two conductive elements each having a top surface exposed at the front surface and a bottom surface remote therefrom;
forming at least one first opening extending from the rear surface partially through the semiconductor element towards the front surface;
forming at least two second openings extending from the at least one first opening, each exposing at least a portion of the bottom surface of a respective one of the least two conductive elements, the at least two second openings not extending through either of the at least two conductive elements;
forming at least one conductive via within each of the at least one second openings, including depositing an electrically conductive material in contact with the at least two conductive element;
forming a dielectric region filling the at least one first opening, the dielectric region having a top surface facing in a second direction opposite from the first direction, and forming at least two apertures penetrating through the dielectric region; and
forming at least two conductive contacts, and at least two conductive interconnects each coupled to a respective one of the conductive contacts, each conductive interconnect extending within one or more of the first openings at least within a respective one of the apertures and formed by steps including depositing a conductive material within the first and second openings onto a respective one of the at least two conductive elements, each of the conductive contacts exposed at the rear surface of the semiconductor element for electrical connection to an external device, and wherein the step of forming the at least two conductive contacts includes depositing an electrically conductive material such that a bottom surface of each of the at least two conductive contacts faces in the first direction and is formed in direct contact with the top surface of the dielectric region, the at least two conductive contacts each located completely within a boundary defined by edges of the first opening in a lateral direction along the rear surface, the bottom surface of the conductive contact located at or above a plane defined by the rear surface of the semiconductor element.

49. A method as claimed in claim 48, wherein the step of forming the at least two conductive interconnects includes plating an inner surface of each of the apertures.

50. A method as claimed in claim 48, wherein each conductive contact has a width in the lateral direction that is greater than a width of at least a portion of the conductive interconnect that is adjacent the conductive contact.

51. A method as claimed in claim 48, wherein the at least one first opening is formed by directing a jet of abrasive particles towards the semiconductor element.

\* \* \* \* \*